(12) United States Patent
Nomura

(10) Patent No.: US 9,182,590 B2
(45) Date of Patent: Nov. 10, 2015

(54) METHOD FOR MANUFACTURING ELECTROWETTING ELEMENT AND ELECTROWETTING DISPLAY

(71) Applicant: SEKISUI CHEMICAL CO., LTD., Osaka (JP)

(72) Inventor: Shigeki Nomura, Osaka (JP)

(73) Assignee: SEIKSUI CHEMICAL CO., LTD., Osaka (JP)

(*) Notice: Subject to any disclaimer, the term of this patent is extended or adjusted under 35 U.S.C. 154(b) by 73 days.

(21) Appl. No.: 14/348,724

(22) PCT Filed: Sep. 18, 2012

(86) PCT No.: PCT/JP2012/073814
§ 371 (c)(1),
(2) Date: Mar. 31, 2014

(87) PCT Pub. No.: WO2013/061711
PCT Pub. Date: May 2, 2013

(65) Prior Publication Data
US 2014/0226200 A1    Aug. 14, 2014

(30) Foreign Application Priority Data

Oct. 24, 2011 (JP) ................................ 2011-233199
Feb. 28, 2012 (JP) ................................ 2012-041772
Apr. 26, 2012 (JP) ................................ 2012-101291
Jul. 5, 2012  (JP) ................................ 2012-151661

(51) Int. Cl.
*G02B 26/00* (2006.01)
*G02B 26/02* (2006.01)
(Continued)

(52) U.S. Cl.
CPC ............ *G02B 26/005* (2013.01); *G02B 26/004* (2013.01); *G09G 3/348* (2013.01);
(Continued)

(58) Field of Classification Search
CPC .... G02B 26/004; G02B 26/005; G02B 26/02; G02B 26/08; G02B 5/24; G02B 1/06; G09G 3/34; G09G 3/348; G03F 7/0045; G03F 7/0048; G03F 7/038; B01L 3/5027; B01L 3/502707; B01L 3/502792; G09F 9/30; C09D 11/10

USPC ......... 359/290, 291, 295, 298, 228, 245, 253, 359/665, 666; 345/60, 64, 204, 212, 214; 524/445, 495, 496, 609; 252/583
See application file for complete search history.

(56) References Cited

U.S. PATENT DOCUMENTS 8,111,465 B2 *  2/2012  Heikenfeld et al. ........... 359/665
8,669,325 B1 *  3/2014  Hyman ........................ 524/609
(Continued)

FOREIGN PATENT DOCUMENTS

JP    2006-235366    9/2006
JP    2006-350328    12/2006
(Continued)

OTHER PUBLICATIONS

International Search Report issued Nov. 13, 2012 in International (PCT) Application No. PCT/JP2012/073814.
(Continued)

*Primary Examiner* — Loha Ben
(74) *Attorney, Agent, or Firm* — Wenderoth, Lind & Ponack, L.L.P.

(57) ABSTRACT

The present invention relates to a method for manufacturing an electrowetting element, in which a first liquid material and a second liquid material having a surface energy which is lower than that of the first liquid material, which are not mixed together, are provided in a cell formed between a first substrate and a second substrate placed as facing; at least one of the first liquid material and the second liquid material is gelated or altered to have high viscosity; and the shape of the interface between the first liquid material and the second liquid material is changed by applying voltage in the cell. The method includes a step of stimulating at least one of the first liquid material and the second liquid material which is gelated or altered to have high viscosity, to alter one of the first liquid material and the second liquid material to have low viscosity. According to the present invention, an electrowetting element can be manufactured easily, and the electrowetting element manufactured by the present invention does not show increase of applied voltage, delay of operation and the like.

23 Claims, 8 Drawing Sheets

(51) Int. Cl.
*G02B 1/06* (2006.01)
*G09G 3/34* (2006.01)
*G02B 26/08* (2006.01)
*G09F 9/30* (2006.01)
*B01L 3/00* (2006.01)
*G03F 7/004* (2006.01)
*G03F 7/038* (2006.01)
*G02B 5/24* (2006.01)

(52) U.S. Cl.
CPC ...... *B01L3/502707* (2013.01); *B01L 3/502792* (2013.01); *G02B 1/06* (2013.01); *G02B 5/24* (2013.01); *G02B 26/02* (2013.01); *G02B 26/08* (2013.01); *G03F 7/0048* (2013.01); *G03F 7/038* (2013.01); *G09F 9/30* (2013.01)

(56) References Cited

U.S. PATENT DOCUMENTS

| | | | | |
|---|---|---|---|---|
| 8,896,903 | B2* | 11/2014 | Vermeulen et al. | 359/290 |
| 8,896,928 | B2* | 11/2014 | Nakasuga et al. | 359/665 |
| 8,921,473 | B1* | 12/2014 | Hyman | 524/445 |

FOREIGN PATENT DOCUMENTS

| | | |
|---|---|---|
| JP | 2008-170586 | 7/2008 |
| JP | 2009-31795 | 2/2009 |
| JP | 2009-210738 | 9/2009 |
| JP | 2010-85966 | 4/2010 |
| JP | 2011-124122 | 6/2011 |
| WO | 2005/098797 | 10/2005 |

OTHER PUBLICATIONS

Notice of Allowance issued Jan. 28, 2014 in Japanese Application No. 2013-502728, with English translation.
Beni et al., "Electro-wetting displays", Applied Physics Letters, vol. 38, Issue 4, 1981, pp. 207-209.
Abdallah et al., "n-Alkanes Gel n-Alkanes (and Many Other Organic Liquids)", Langmuir, vol. 16, 2000, pp. 352-355.
Ketner et al., "A Simple Class of Photorheological Fluids: Surfactant Solutions with Viscosity Tunable by Light", Journal of American Chemical Society, vol. 129, No. 6, 2007, pp. 1553-1559.
Hanabusa et al., "Organogel from L-leucine-containing surfactant in nonpolar solvents", Colloid & Polymer Science, vol. 276, No. 3, 1998, pp. 252-259.
Tung et al., "Self-assembled organogels obtained by adding minute concentrations of a bile salt to AOT reverse micelles", Soft Matter, vol. 4, 2008, pp. 1086-1093.
Trivedi et al., "Cation-Induced Supramolecular Isomerism in the Hydrogen-Bonded Network of Secondary Ammonium Monocarboxylate Salts: A New Class of Organo Gelator and Their Structures", Crystal Growth & Design, vol. 6, No. 9, 2006, pp. 2114-2121.
Eastoe et al., "A photo-responsive organogel", Chemical Communications, 2004, pp. 2608-2609.
Murata et al., "Thermal and Light Control of the Sol-Gel Phase Transition in Cholesterol-Based Organic Gels. Novel Helical Aggregation Modes As Detected by Circular Dichroism and Electron Microscopic Observation", Journal of the American Chemical Society, vol. 116, 1994, pp. 6664-6676.
Ayabe et al., "Binary organogelators which show light and temperature responsiveness", Organic & Biomolecular Chemistry, vol. 1, 2003, pp. 2744-2747.

* cited by examiner (a)

(b)

(c)

(a)

(b)

(c)

METHOD FOR MANUFACTURING ELECTROWETTING ELEMENT AND ELECTROWETTING DISPLAY

TECHNICAL FIELD

The present invention relates to a method for manufacturing an electrowetting element and to an electrowetting display. Priority is claimed on Japanese Patent Application No. 2011-233199, filed on Oct. 24, 2011, Japanese Patent Application No. 2012-041772, filed on Feb. 28, 2012, Japanese Patent Application No. 2012-101291, filed on Apr. 26, 2012, and Japanese Patent Application No. 2012-151661, filed on Jul. 5, 2012, and the contents of which are incorporated herein by reference.

BACKGROUND ART

In recent years, electrowetting elements which utilize electrowetting effects have been attracting attention. Generally, an electrowetting element consists of a pair of substrates, and a liquid having relatively high surface energy and a liquid having relatively low surface energy, which are not mixed together, are filled between the pair of substrates. One of the pair of substrates has an electrode layer on a surface thereof, and a hydrophobic middle layer (insulating layer) is formed on a surface of the electrode layer. Electrowetting elements have properties that, when voltages are applied between hydrophilic liquids and electrode layers through hydrophobic middle layers, the hydrophilic liquids are attracted to the hydrophobic middle layers, and thus shapes of interfaces between the hydrophilic liquids and the hydrophobic liquids are altered. By utilizing such properties, electrowetting elements are used for optical lenses, display elements and the like (Non Patent Document 1).

As methods for manufacturing electrowetting elements described above, the methods disclosed in the following Patent Documents 1 and 2 have been known.

In the manufacturing method disclosed in Patent Document 1, a substrate surface is covered with a liquid having high surface energy (water), and an opening is provided on top of the substrate surface. Note that the substrate surface has hydrophobic first regions, and each of the first regions is surrounded by second hydrophilic regions (pixel walls).

When an injector, in which a low surface energy liquid (oil) is filled, ejects oil so as to move the oil along the substrate surface, drops of the low surface energy liquid are drawn into the first region, and a high surface energy liquid contacted with the first region is substituted with a layer of the low surface energy liquid.

Also, in the method for manufacturing an electrowetting device disclosed in Patent Document 2, first and second liquids in which one of them is conductive (high surface energy) and the other is insulative (low surface energy) are used, and the method comprises steps of making a chamber having a liquid inlet and a liquid outlet, and sealing the inside of the chamber by closing the liquid inlet and the liquid outlet after the first liquid and the second liquid are in turn introduced to the inside of the chamber.

CITATION LIST

Patent Document

[Patent Document 1]
PCT International Publication No. WO05/098797
[Patent Document 2]
Japanese Unexamined Patent Application, First Publication No. 2008-170586

Non Patent Document

[Non Patent Document 1]
G. Beni and S. Hackwood, Electro-wetting displays, Applied Physics Letters Vol. 38, Issue 4, 1981, American Institute of Physics, pp. 207-209 (URL: http://www.j-po.go.jp/shiryou/s_sonota/hyoujun_gijutsu/electronicpaper/4-4-4.pdf#1)

SUMMARY OF INVENTION

Technical Problem

However, in the above-described method of Patent Document 1, to reliably perform the step of substituting the low surface energy liquid (oil) for the high surface energy liquid (water) by introducing the low surface energy liquid into the substrate in which the high surface energy liquid is filled, an amount (thickness) and speed of introduction need to be considered for each liquid, which takes more time, and thus applications to large substrates are difficult.

Also, in the above-described method of Patent Document 2, since the liquid inlet and the like are need to be provided separately, a structure of the substrate becomes complicated, the number of manufacturing steps is increased, and an aperture ratio of an element that is a final product is decreased.

These problems on manufacturing electrowetting elements are resulted essentially from that two kinds of liquids are need to be handled at the same time when manufacturing electrowetting elements.

The present invention has completed in the light of these circumstances, and an object of the present invention is to provide a method for manufacturing an electrowetting element and an electrowetting display, in which an electrowetting element can be manufactured efficiently and easily, as well as a good responsiveness of the electrowetting element can be kept.

Solution to Problem

The first aspect of the present invention is a method for manufacturing an electrowetting element, in which a first liquid material and a second liquid material having a surface energy which is lower than that of the first liquid material, which are not mixed together, are provided in a cell formed between a first substrate and a second substrate placed as facing; at least one of the first liquid material and the second liquid material is gelated or altered to have high viscosity; and the shape of the interface between the first liquid material and the second liquid material is changed by applying voltage in the cell; the method including a step of applying a stimulation to at least one of the first liquid material and the second liquid material which is gelated or altered to have high viscosity, to alter at least one of the first liquid material and the second liquid material to have low viscosity.

According to the method for manufacturing an electrowetting element of the present invention, since at least one of the first liquid material and the second liquid material is gelated or altered to have high viscosity to handle it as a solid or a quasi-solid, the essential problem of manufacturing an electrowetting element, that is, handling two kinds of liquids at the same time, can be avoided. Since two kinds of liquids do not need to be handled at the same time, the step becomes simple and easy, existing manufacture devices can be used without any modifications, and problems which affects performance of an element, such as unevenness of an image and the like caused by bias of injection amounts of liquids, can be largely reduced. Since the present invention has a step of stimulating at least one of the first liquid material and the second liquid material which is gelated or altered to have high viscosity, to alter at least one of the first liquid material and the second liquid material to have low viscosity, an electro wetting element having good responsiveness can be manufactured. That is, by employing an easy manufacturing method, in which one kind of liquid is handled, or none of liquids are handled in the middle of manufacture, and finally stimulating a liquid material, which is gelated or altered to have high viscosity, to alter the liquid material to a low viscosity liquid, operativeness and responsiveness of the manufactured electrowetting element can sufficiently be kept.

The second aspect of the present invention is the method for manufacturing an electrowetting element described in the first aspect, including steps of:

placing a predetermined amount of the second liquid material in a region surrounded by partitions which compart the cell formed on the second substrate;

placing the first liquid material, which is gelated or altered to have high viscosity of 1 Pa·s or more, on one surface side of the first substrate; and bonding the first substrate and the second substrate through the first liquid material which is gelated or altered to have high viscosity.

In the present specification, a predetermined amount of the liquid material placed in a region surrounded by partitions which compart cell refers to an amount with which the liquid material is not overflowed to the next regions surrounded by partitions, and the amount is adjustable according to hiding power of the dye, operativeness as electrowetting, and sizes of drops of the low surface energy liquid after an operation.

According to the method for manufacturing an electrowetting element of the present invention, since the step of bonding the first substrate and the second substrate is performed through the first liquid material which is gelated or altered to have high viscosity, bias of liquid materials can be prevented. Accordingly, for example, when an element manufactured by the present invention is used in a display device, a high-quality display device not having unevenness of display can be provided. Also, since dripping of liquids are hardly occurred if the first liquid material is gel-like or in a high viscosity state, the first substrate on which the first liquid material is placed can be handled easily, and the bonding step of substrates can be performed in a short time. According to that, even if an electrowetting element has large substrates, it can be efficiently and easily manufactured.

The third aspect of the present invention is the method for manufacturing an electrowetting element described in the first aspect, including steps of:

placing a predetermined amount of the second liquid material, which is gelated or altered to have high viscosity of 1 Pa·s or more, in a region surrounded by partitions which compart the cell formed on the second substrate;

placing the first liquid material in the region surrounded by partitions; and bonding the first substrate and the second substrate.

According to the method for manufacturing an electrowetting element of the present invention, since the first liquid material is placed in the region in which the second liquid material, which is gelated or altered to have high viscosity, is placed, splash and bias of liquid materials at the time of placing the first liquid material can be prevented. Accordingly, for example, when an element manufactured by the present invention is used in a display device, a high-quality display device not having unevenness of display can be provided. Also, since the second liquid material is gel-like or in a high viscosity state, the step for placing the first liquid material can be performed easily in a short time. According to that, even if an electrowetting element has large substrates, it can be efficiently and easily manufactured.

The fourth aspect of the present invention is the method for manufacturing an electrowetting element described in the first aspect, including steps of:

placing a predetermined amount of the second liquid material, which is gelated or altered to have high viscosity of 1 Pa·s or more, in a region surrounded by partitions which compart the cell formed on the second substrate;

placing the first liquid material on one surface side of the first substrate; and bonding the first substrate and the second substrate through the first liquid material.

According to the method for manufacturing an electrowetting element of the present invention, since the second liquid material, which is gelated or altered to have high viscosity, is placed in a region surrounded by partitions which compart the cell formed on the second substrate; the first liquid material is placed on the first substrate; and the second substrate is bonded to the first substrate; the steps are very easy, and thus a large amount of electrowetting elements can be manufactured in a short time. When bonding the second substrate to the first substrate, the second liquid material provided on the second substrate is gelated or altered to have high viscosity, so that the second liquid material can be treated like solid, and thus flowing or splashing at the time of bonding can be prevented. According to that, even if an electrowetting element has large substrates, it can be efficiently and easily manufactured.

The fifth aspect of the present invention is the method for manufacturing an electrowetting element described in the first aspect, including steps of:

placing a predetermined amount of a mixed liquid of the first liquid material and the second liquid material, which is gelated or altered to have high viscosity of 1 Pa·s or more, in a region surrounded by partitions which compart the cell formed on the second substrate;

placing the first liquid material in the region surrounded by the partitions, or on one surface side of the first substrate; and bonding the first substrate and the second substrate.

According to the method for manufacturing an electrowetting element of the present invention, since the mixture of the first and second liquid materials, which is gelated or altered to have high viscosity, is placed in cells; placing the first liquid material onto the second substrate, on which the mixture of the first and second liquid materials, which is gelated or altered to have high viscosity is placed; and placing the first substrate through the first liquid material; the first and second liquid materials, which are gelated or altered to have high viscosity, are not biased by blowing up or splashing at the time of placing the first liquid material, and thus a high-quality display device having neither unevenness of display nor defect can be provided. In addition, it is also possible that placing the mixture of the first and second liquid materials, which is gelated or altered to have high viscosity, in cells on the second substrate; providing the first liquid material on the first substrate; and bonding the second substrate through the first liquid material provided on the first substrate material. At this time, since the first and second liquid materials placed on the second substrate are gelated or altered to have high viscosity, the first and second liquid materials are not flowed down and biased even when the second substrate is inverted to be bonded to the first substrate side, and thus a high-quality display device having neither unevenness of display nor defect can be provided. As stated, since the first and second liquid materials are gel-like or in high viscosity states, they are not flowed, splashed, and blown up, and thus the first liquid can be handled easily at the time of placing, and the bonding step of substrates can be performed in a short time.

According to that, even if an electrowetting element has large substrates, it can be efficiently and easily manufactured.

The sixth aspect of the present invention is the method for manufacturing an electrowetting element described in the first aspect, including steps of:

placing a predetermined amount of the second liquid material, which is gelated or altered to have high viscosity of 1 Pa·s or more, in a region surrounded by partitions which compart the cell formed on the second substrate;

placing the first liquid material, which is gelated or altered to have high viscosity of 1 Pa·s or more, on one surface side of the first substrate; and bonding the first substrate and the second substrate through the first liquid material which is gelated or altered to have high viscosity.

The method for manufacturing an electrowetting element of the present invention includes steps of: providing the second liquid material, which is gelated or altered to have high viscosity, in a region surrounded by partitions which compart the cell formed on the second substrate; providing the first liquid material, which is gelated or altered to have high viscosity, on the first substrate; and bonding the first substrate and the second substrate. Since the second liquid material and the first liquid material, each of them is provided on the second substrate and the first substrate respectively, are gelated or altered to have high viscosity, the first and second substrates can be handled easily, and the bonding step of substrates can be performed in a short time. Also, since the first liquid material and the second liquid material are gelated or altered to have high viscosity, each liquid is not blown up, splashed, and biased at the time of bonding, and thus a high-quality electrowetting element having neither unevenness of display nor defect can be provided.

The seventh aspect of the present invention is the method for manufacturing an electrowetting element described in the first aspect, including steps of:

forming a laminate by laminating the first liquid material which is gelated or altered to have high viscosity of 1 Pa·s or more and the second liquid material which is gelated or altered to have high viscosity of 1 Pa·s or more; and bonding the first substrate and the second substrate by using the laminate.

According to the method for manufacturing an electrowetting element of the present invention, since the bonding step of the first substrate and the second substrate is performed by using the laminate consisting of the first and second liquid materials which are gelated or altered to have high viscosity, stable amounts of liquids can be placed in display cells, and thus a high-quality electrowetting element having neither unevenness of display nor defect can be provided. Also, since the laminate used is gel-like or in a high viscosity state, an electrowetting element can be manufactured by a step suitable for a large-scale production, such as transfer. Therefore, even if an electrowetting element has large substrates, it can be efficiently and easily manufactured.

The eighth aspect of the present invention is the method for manufacturing an electrowetting element described in the seventh aspect, in which the bonding step is performed by transferring the laminate onto one of the first substrate and the second substrate.

In the method for manufacturing an electrowetting element described above, the bonding step is preferably performed, provided that the laminate is transferred onto one of the first substrate and the second substrate.

According to the structure, a laminate is transferred onto either the first substrate or the second substrate, the bonding step of the first substrate and the second substrate can be performed rapidly and easily.

The ninth aspect of the present invention is the method for manufacturing an electrowetting element described in any one of the first to eighth aspects, in which the stimulation is selected from the group consisting of contact with a chemical substance, irradiation with electromagnetic wave, heat, sonic waves, vibration, electric field and magnetic field.

According to this structure, since viscosity of at least one of the first liquid material and the second liquid material can be reduced by performing an easy step, such as contact with a chemical substance or irradiation with electromagnetic wave, responsiveness on alteration of the shape of the interface between the first liquid material and the second liquid material can be improved when operating the electrowetting element, i.e., when applying voltage in cells.

The tenth aspect of the present invention is the method for manufacturing an electrowetting element described in any one of the first, third, fourth, sixth, and ninth aspects, in which the second liquid material is gelated or altered to have high viscosity of 1 Pa·s or more by using a gelling agent or a viscosity increasing agent for the second liquid material, and the gelling agent or the viscosity increasing agent is dissolved in the first liquid material.

According to this structure, since the gelling agent or the viscosity increasing agent for the second liquid material is dissolved in the first liquid material, the second liquid material, which is gelated or altered to have high viscosity, contacts the first liquid material, and thereby the gelling agent or the viscosity increasing agent is transferred to the first liquid. As a result, the second liquid material, which is gelated or altered to have high viscosity, becomes a low viscosity liquid sufficient to be operated as an electrowetting element. On the other hand, since the gelling agent or the viscosity increasing agent is dissolved in the first liquid material, the first liquid material is not gelated or altered to have high viscosity, and thus the first liquid material also becomes a low viscosity liquid sufficient to be operated as an electrowetting element.

The eleventh aspect of the present invention is the method for manufacturing an electrowetting element described in the tenth aspect, in which the gelling agent or the viscosity increasing agent is represented by the following general formula (1).

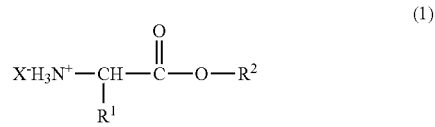

In the formula (1), $X^-$ represents a monovalent anion group; $R^1$ represents a monovalent substituent of 1 to 9 carbon atoms, and may contain any one selecting from the group consisting of oxygen, nitrogen and sulfur, and may contain a cyclic structure; and $R^2$ represents a monovalent substituent of 1 to 20 carbon atoms.

The twelfth aspect of the present invention is the method for manufacturing an electrowetting element described in the eleventh aspect, in which $X^-$ is a conjugate base of an acid having an aromatic group.

The thirteenth aspect of the present invention is the method for manufacturing an electrowetting element described in the eleventh or twelfth aspect, in which $R^1$ is any one of a methyl group, an isopropyl group, an isobutyl group, a sec-butyl group, and a benzyl group.

The fourteenth aspect of the present invention is the method for manufacturing an electrowetting element described in any one of the first to thirteenth aspects, in which $R^2$ is a linear chain alkyl group of 6 to 20 carbon atoms.

The fifteenth aspect of the present invention is the method for manufacturing an electrowetting element described in the tenth aspect, in which the gelling agent or the viscosity increasing agent contains a compound represented by the following structural formula (2).

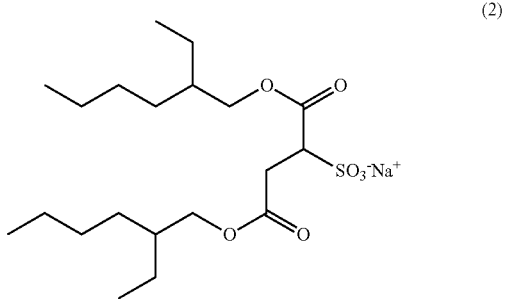

(2)

The sixteenth aspect of the present invention is the method for manufacturing an electrowetting element described in the fifteenth aspect, in which the gelling agent or the viscosity increasing agent is a mixture of the compound represented by the structural formula (2) and a steroid compound or a phenolic compound.

The seventeenth aspect of the present invention is the method for manufacturing an electrowetting element described in the sixteenth aspect, in which the phenolic compound is hydroquinone or resorcinol.

The eighteenth aspect of the present invention is the method for manufacturing an electrowetting element described in the tenth aspect, in which the gelling agent or the viscosity increasing agent contains a compound represented by the following general formula (3).

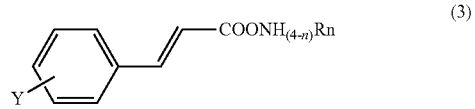

(3)

In the formula, n represents an integer of 1 to 3; R represents a monovalent organic group; and Y represents an optional monovalent substituent.

The nineteenth aspect of the present invention is the method for manufacturing an electrowetting element described in the eighteenth aspect, in which Y is any one of a methyl group, a chloro group, and a bromo group.

The twentieth aspect of the present invention is the method for manufacturing an electrowetting element described in the eighteenth aspect, in which R is an aliphatic hydrocarbon or aralkyl group of 6 to 20 carbon atoms.

The twenty-first aspect of the present invention is the method for manufacturing an electrowetting element described in any one of the first, second, fourth, and fifth aspects, in which the first liquid material is gelated or altered to have high viscosity of 1 Pa·s or more by using a gelling agent or a viscosity increasing agent for the first liquid material, and the gelling agent or the viscosity increasing agent is dissolved in the second liquid material.

According to this structure, since the gelling agent or the viscosity increasing agent for the first liquid material is dissolved in the second liquid material, the first liquid material, which is gelated or altered to have high viscosity, contacts the second liquid material, and thereby the gelling agent or the viscosity increasing agent is transferred to the second liquid material. As a result, the first liquid material, which is gelated or altered to have high viscosity, becomes a low viscosity liquid sufficient to be operated as an electrowetting element. On the other hand, since the gelling agent or the viscosity increasing agent is dissolved in the second liquid material, the second liquid material is not gelated or altered to have high viscosity, and thus the second liquid material also becomes a low viscosity liquid sufficient to be operated as an electrowetting element.

The twenty-second aspect of the present invention is the method for manufacturing an electrowetting element described in any one of the first to twenty-first aspects, in which the step of altering at least one of the first liquid material and the second liquid material, which is gelated or altered to have high viscosity, to have low viscosity by stimulating inside of the cells, is performed after the bonding step of the first substrate and the second substrate.

According to this structure, since viscosity of at least one of the first liquid material and the second liquid material can be reduced by performing an easy step, such as stimulation, responsiveness on alteration of the shape of the interface between the first liquid material and the second liquid material can be improved when applying voltage in cells.

The twenty-third aspect of the present invention is an electrowetting display consisting of an electrowetting element manufactured by the method for manufacturing an electrowetting element described in any one of the first to twenty-second aspects.

Since the electrowetting display of the present invention is composed of the electrowetting element manufactured according to the method described above, a high-quality image having neither unevenness of display nor defect can be displayed.

Advantageous Effects of Invention

According to the present invention, an electrowetting element can be manufactured easily. The electrowetting element manufactured by the manufacturing method of the present invention does not show increase of applied voltage, delay of operation and the like, and thus a display with high-quality is possible. when used, for example, as a display element.

DESCRIPTION OF EMBODIMENTS

Hereinafter, embodiments according to the method for manufacturing an electrowetting element of the present invention will be explained.

(First Embodiment)

Figure 1:
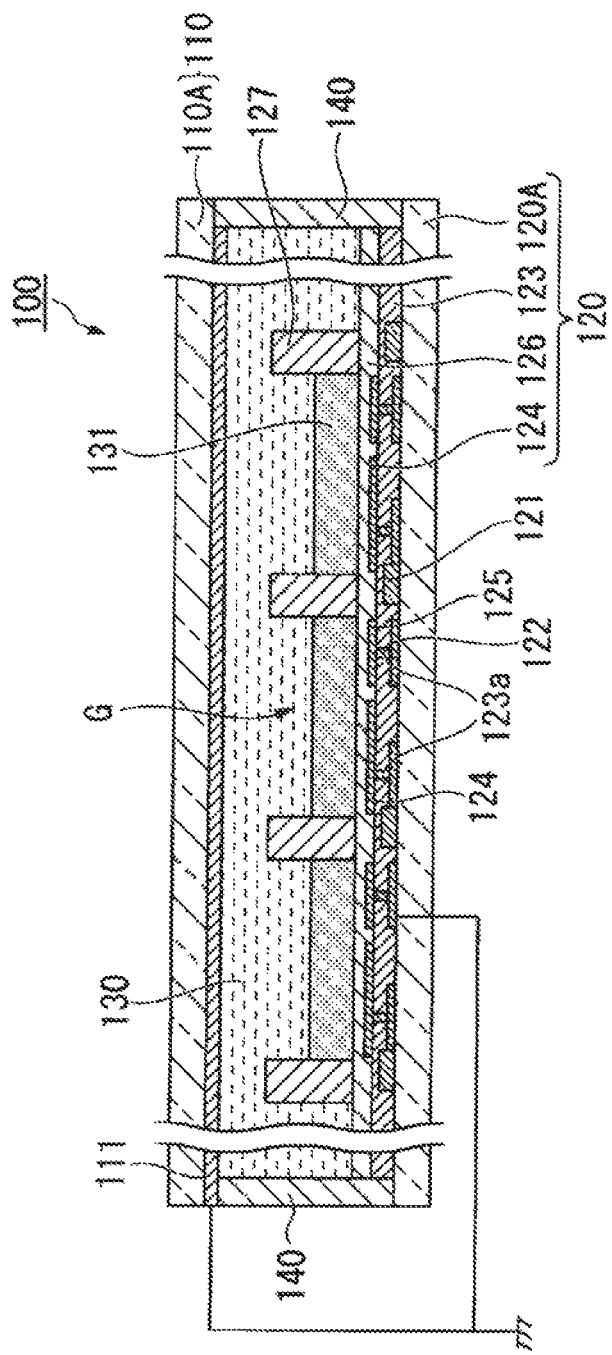
FIG. 1 shows the cross-sectional structure of the electrowetting display according to the first embodiment.
Figure 2:
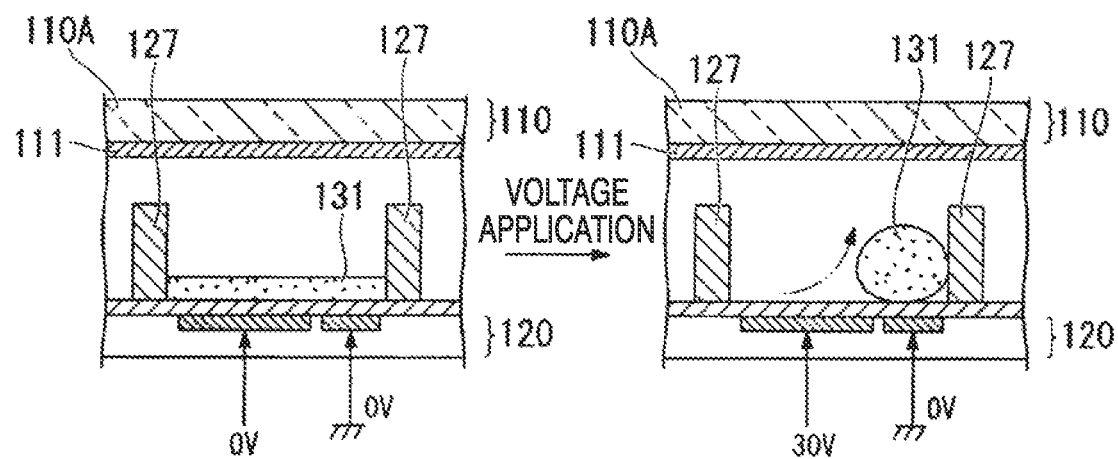
FIG. 2 explains the concept for operating the electrowetting display.

FIG. 1 represents a structural example of the electrowetting display, as one example of the structure of the electrowetting element manufactured by the present invention. FIG. 2 explains the concept for operating the electrowetting display. Note that structures not necessary to explain are shown as simplified in FIG. 2.

The electrowetting display 100 shown in FIG. 1 has the first substrate 110 and the second substrate 120, and these substrates 110 and 120 are placed as facing through the high surface energy liquid 130. The high surface energy liquid 130 is placed in a region comparted by the sealing materials 140, which are provided along the circumference of the substrates 110 and 120. The high surface energy liquid 130 has relatively high surface energy compared to the low surface energy liquid 131 described below. Note that, in the present specification, a "cell" is referred to as the region generated between the first substrate 110 and the second substrate 120, in which the high surface energy liquid 130 and the low surface energy liquid 131 are provided.

The first substrate 110 has the base material 110A and the common electrode 111. The second substrate 120 has the base material 120A, the TFT 121, the wiring portion 122, the flat film 123, the pixel electrode 124, the common electrode 125, and the insulating film 126. The surface of the insulating film 126 is treated to be water-repellent. The water-repellent treatment is not particularly limited, and known methods can be used; however for example, coating with a fluorine resin and heat treatment were performed in the present embodiment. The base material 120A described above is composed of, for example, substances conventionally used as panel substrates of display devices, such as glass, resin molded form, film and the like. For example, glass was used in the present embodiment. The pixel electrode 124 and the common electrode 125 are formed on the flat film 123, and are connected with the TFT 121 and the wiring portion 122 through the contact hole 123a.

A transparent electrode is preferable as a material composing the common electrode 111, and representative example thereof is the ITO (Indium Tin Oxide). Also, the ITO, Al and the like are used as materials composing the pixel electrode 124 and the common electrode 125. When the ITO is used as a material for electrodes, the electrowetting display 100 becomes a transmission type display, in which a light source (not shown in the figures) is provided on a back surface side of the second substrate 120. Also, when the Al is used as a material for electrodes, the electrowetting display 100 becomes a reflection type display, in which light from outside is reflected on a surface of an electrode. The present invention is applicable to transmission type, reflection type, or semi-transmission reflection type displays.

The first substrate 110 is composed mainly of the base material 110A. The base material 110A described above is composed of, for example, substances conventionally used as panel substrates of display devices, such as glass, resin molded form, film and the like. For example, glass was used in the present embodiment.

The pixel wall 127 is formed on the above-described insulating film 126 of the second substrate 120. The pixel wall 127 is formed as a lattice shape, and comparts a plurality of the pixels G on the second substrate 120. In the present embodiment, although the pixel wall 127 is not contacted with the first substrate 110 as shown in FIG. 1, the structure in which part or all of the upper side of the pixel wall 127 contacts the first substrate 110 can be employed if desired. A pair of the pixel electrodes 124 and a pair of the common electrodes 125 are placed in each of the pixels G. The low surface energy liquid 131 is stored in the region (the pixel G) comparted by the pixel walls 127. The surface of the pixel wall 127 is well fitted to the high surface energy liquid 130.

As shown in FIG. 2, by applying a predetermined voltage to the pixel electrode 124, a capacitor, in which the pixel electrode 124 and the high surface energy liquid 130 are electrodes, and the insulating film 126 is a dielectric, is prepared. By polarization of the insulating film 126, the high surface energy liquid 130 is attracted because of an electrostatic interaction. As a result, the low surface energy liquid 131 on a pixel electrode is pushed onto the common electrode 125, and thereby the shape of the liquid interface is changed. As stated, by selectively moving the low surface energy liquid 131 in the pixel G onto the common electrode 125, the light passing through each of the pixels G can be switched either to penetrate the low surface energy liquid 131 or to substantially penetrate the low surface energy liquid 131.

The low surface energy liquid 131 described above contains a low surface energy solvent and a coloring material.

The low surface energy solvent is not particularly limited, provided that a surface energy value thereof is 35 ml/m$^2$ or below. When the surface energy value is over 35 mJ/m$^2$, the low surface energy solvent may be mixed with a high surface energy liquid. The surface energy value is more preferably 30 mJ/m$^2$ or below, and still more preferably 20 mJ/m$^2$ or below.

Also, since the low surface energy liquid 131 described above is preferably not caked/crystallized, and not gasified/boiled at the time of usual use and storing, the melting point is preferably −10° C. or below, more preferably −20° C. or below, and still more preferably −40° C. or below. The boiling point is preferably 80° C. or above, more preferably, 120° C. or above, and still more preferably 150° C. or above.

In addition, since operation speed is decreased when the viscosity of the low surface energy liquid 131 is higher, the viscosity is preferably 300 mPa·s or below, more preferably 100 mPa·s or below, and still more preferably 30 mPa·s or below at temperatures within a range of operation temperatures.

Examples of the low surface energy solvent are shown below; however, the present invention is not limited thereto.

The examples include linear or branched alkanes, such as heptane, octane, nonane, decane, undecane, dodecane and the like; cyclic alkanes, such as cyclohexane, cycloheptane and the like; silicones, such as octamethyltrisiloxane, decamethyltetrasiloxane, decamethylcyclopentasiloxane, dodecamethylpentasiloxane and the like; fluorocarbon and the like. These low surface energy solvents can be used alone, or used as combination of two kinds or more thereof The coloring material described above is not particularly limited, and various pigments and dye, for example, inorganics, such as titanium oxide, carbon black and the like; organics, such as phthalocyanine, azos, anthraquinone and the like can be used. As properties of a solution used for electrowetting, the solution needs to be dissolved or dispersed in a low surface energy liquid, but not to be dissolved/dispersed in a high surface energy liquid, and thus hydrophobic surface treated pigments and hydrophobic dye are suitably used.

Among these combinations, although a combination of linear or branched alkane and a hydrophobic pigment such as carbon black and the like or alkyl group-modified dye is preferable in the present invention, the present invention is not limited thereto.

In addition, if desired, additives such as an antioxidant, a ultraviolet blocking agent, a stabilizer, a dispersion stabilizer, a surfactant, a hydrophobic electrolyte and the like can be added to the low surface energy solvent.

The high surface energy liquid 130 described above contain a high surface energy solvent as a main component, and additives such as an electrolyte, a surfactant and the like can be added if desired. The high surface energy solvent is not particularly limited, provided that a surface energy value thereof is 45 mJ/m$^2$ or above. When the surface energy value is below 45 mJ/m$^2$, the high surface energy solvent may be mixed with a low surface energy liquid. The surface energy value is more preferably 55 mJ/m$^2$ or above, and still more preferably 65 mJ/m$^2$ or above.

In the same manner as the low surface energy liquid, the high surface energy liquid is preferably not caked/crystallized, and not gasified/boiled at the time of usual use and storing, the melting point is preferably −10° C. or below, more preferably −20° C. or below, and still more preferably −40° C. or below. The boiling point is preferably 80° C. or above, more preferably, 120° C. or above, and still more preferably 150° C. or above.

Examples of the high surface energy solvent are shown below; however, the present invention is not limited thereto.

The examples include water or an electrolyte aqueous solution; polyhydric alcohols, such as ethylene glycol, propylene glycol and the like. These high surface energy solvents can be used alone, or used as combination of two kinds or more thereof. Also, to increase surface energy, or to adjust a melting point and a boiling point, additives, ions and the like can be added. Note that, there are liquids having a surface energy value which is not high, but have a high polarity. Such liquids are not mixed with the low surface energy liquid 131, and can also be used as 130. Specifically, the liquids are low molecular weight alcohols, such as methanol, ethanol and the like, or mixture thereof and the like.

Hereinafter, the first manufacturing method of the above-described electrowetting display 100 will be explained as referring to the figures from FIG. 3 to FIG. 6.

Figure 3:
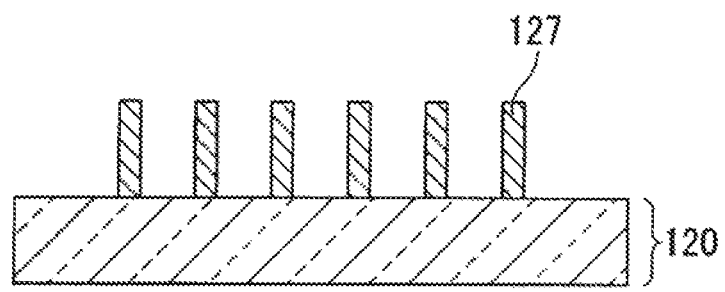
FIG. 3 shows the manufacturing step of the electrowetting display according to the first embodiment.

Firstly, as shown in FIG. 3, the second substrate 120, which is manufactured by a conventional technique, is prepared, and the pixel walls 127 are formed on the second substrate 120.

Although the height of the pixel wall 127 is not particularly limited, a height with which a low surface energy liquid is not overflowed to the next pixels, and masking by pixel walls is not occurred when viewing from the oblique direction is preferable. Since the height of the pixel wall 127 depends on an interval of pixel walls and an amount of a low surface energy liquid, it cannot be generalized; however, as an example, the height is preferably from 2 to 80 μm, more preferably from 2 to 50 μm, and still more preferably from 2 to 30 μm.

When the width of the pixel wall 127 is thinner, a high-contrast image can be obtained because of a high aperture ratio, while a manufacturing method becomes difficult, and deflection, collapse, fracture and the like may occur. Accordingly, the width of the pixel wall 127 is preferably from 2 to 30 μm, and more preferably from 5 to 25 μm.

When the interval of the pixel walls 127 is narrower, a highly-fine image can be obtained; however, when it is too narrow, an aperture ratio becomes smaller, and a view angle also becomes narrower, which results in decrease of contrast, and manufacture of electrodes and the like also becomes difficult. Accordingly, the interval of the pixel walls 127 is preferably from 30 to 1000 μm, more preferably from 50 to 300 μm, still more preferably from 80 to 160 μm.

Preferably, a bottom portion of the pixel G is water-repellent, and lateral surfaces are hydrophilic. Therefore, the surface of the second substrate 120 may be previously subjected to a water-repellent treatment by a known method, such as a fluorine resin treatment, and also, after forming the pixel walls 127, a water-repellent material may be coated on bottom portions of pixels by a known method, or may perform a water-repellent treatment. Note that, since the pixel wall 127 is mostly a resist material, it is generally a hydrophilic material; however, a hydrophilic treatment (plasma treatment, corona treatment and the like) may be performed if desired.

Figure 4:
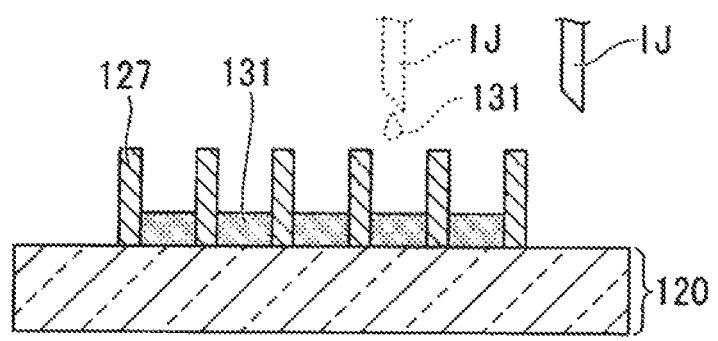
FIG. 4 explains the manufacturing step following FIG. 3.

Then, as shown in FIG. 4, injecting the low surface energy liquid 131 into each region of the second substrate 120, which is comparted by the pixel walls 127. The ink-jet device IJ may be used for the injection. Alternatively, the low surface energy liquid 131 dissolved in a volatile solvent may be filled in the pixel G, and then the volatile solvent may be volatilized by heating and the like to form a desired layer of the low surface energy liquid 131. As stated, the method is not particularly limited, provided that the desired low surface energy liquid 131 can be injected into the pixel G. As other methods for placing the low surface energy liquid 131 in the pixel G, screen printing, flexo printing, a gravure printing method, a curtain coating method, a dispensing method and the like can be employed.

Also, for example, a display corresponding to a color can be realized by injecting the low surface energy liquid 131, which contains each color material, into a desired position with an ink-jet device. When a monochrome, a monocolor, or a color filter is used, a method in which pouring the low surface energy liquid 131 diluted with a volatile solvent into a whole substrate, and then volatilizing the solvent, can be employed.

An amount of the low surface energy liquid 131 to be injected into the pixel G is adjusted depending on hiding power of the dye, operativeness as electrowetting, and sizes of drops of the low surface energy liquid alter an operation. When hiding power of the dye is not sufficient, an amount of the low surface energy liquid 131 should be increased; however, when an amount is increased, an operation is delayed and high driving voltage is required. Also, since sizes of drops of the low surface energy liquid after an operation is increased, a height of the pixel wall 127 needs to be increased, and thus a view angle and contrast are decreased. As described above, a preferable amount of the low surface energy liquid 131 injected into the pixel G (a liquid thickness in the pixel G) cannot be generalized because it may be affected by various factors; however, as an example, the thickness is preferably from 1 to 15 μm, more preferably from 2 to 8 μm, and still more preferably from 3 to 5 μm.

Introducing the high surface energy liquid 130 into the obtained structure as described above, which is shown in FIG. 4, is difficult if the high surface energy liquid 130 is remained to be a liquid form. The reason is that, when introducing the high surface energy liquid 130 to the low surface energy liquid 131, which is placed on the second substrate 120 with a constant thickness, it is highly likely that the high surface energy liquid 130 squirts from the pixel G or moves to another pixel G, due to vigorous influx thereof. Also, since the specific gravity of the low surface energy liquid 131 is generally lighter than that of the high surface energy liquid 130, the low surface energy liquid 131 is lifted by vigorous influx. As stated, a placing amount of the low surface energy liquid 131 is altered by influx of the high surface energy liquid 130, which results in unevenness of an image of a display device. To prevent volume alteration and the like of the low surface energy liquid 131, which is caused by introduction of the high surface energy liquid 130, the 130 is required to be introduced with very slow speed, and for that, manufacture takes many hours, and a dedicated device is needed.

The present invention is completed by solving such problems.

Figure 5:
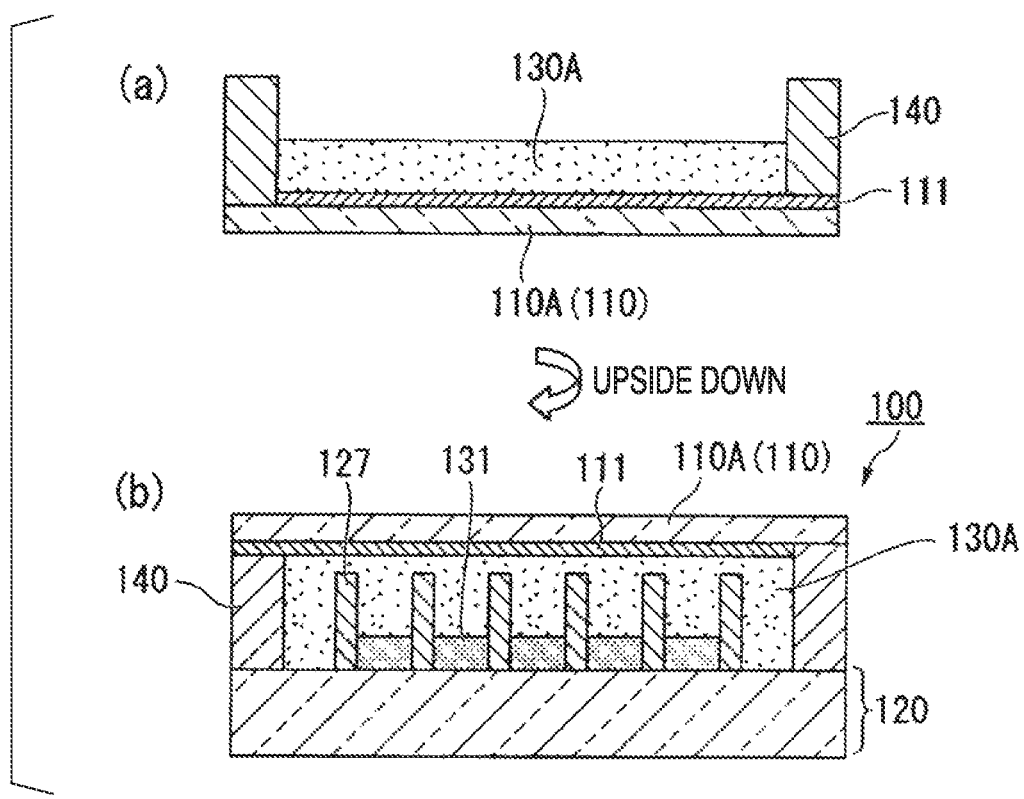
FIG. 5 explains the manufacturing step following FIG. 4.

That is, the first substrate 110 and the second substrate 120 are bonded through the high surface energy liquid 130. Specifically, as shown in FIG. 5, the sealing material 140 is placed on the common electrode 111 side of the first substrate 110, along the circumference. The high viscosity material 130A consisting of the high surface energy liquid 130, which is gelated or adjusted to have viscosity of 1 Pa·s or more, is placed inside of the first substrate 110 which contains the sealing material 140. It is necessary that the high viscosity material 130A does not flow even when inverted, and materials conditioned as paste-like, gel-like, semi-solid states, pseudo-solid states and the like are included.

As stated, the high surface energy liquid 130 is gelated or altered to have high viscosity to prepare the 130A; the 130A is placed on the first substrate 110; the first substrate 110 is turned upside down; and the first substrate 110 and the second substrate 120 are bonded through the sealing material 140. At this time, since the 130A is gel-like or in a high viscosity state, the thickness thereof is not largely changed even when the 130A is turned upside down.

In the present embodiment, by using the gel or high viscosity material 130A, the bonding step, which is an easy and productive method, can be used for placing the high surface energy liquid 130 onto the low surface energy liquid 131. Note that, to prevent an influx of air bubbles at the time of bonding, a bonding angle may be adjusted, substantially vacuum atmosphere may be introduced at the time of bonding, or an air vent hole may be provided on a portion of the first substrate 110 or of the sealing material 140.

As stated, altering the high surface energy liquid 130 to have high viscosity, or gelating results in a large merit at the time of manufacture. On the other hand, when electrowetting element is used particularly as a display element, altering the high surface energy liquid 130 to have high viscosity, or gelating results in a demerit. That is, the operation speed is delayed, and sometimes it may not be operable. Also, when the high surface energy liquid 130 forms an element of high viscosity or gel-like, the shape of the interface between the high surface energy liquid 130 and the low surface energy liquid 131 may not be altered when voltage is applied. In addition, even if the shape of the interface can be altered by applying high voltage, the shape may not be restored when canceling the voltage.

Accordingly, in the present embodiment, when the high surface energy liquid 130 is gelated or altered to have high viscosity, a gelling agent or a viscosity increasing agent, which is stimulation-responsive, is used as a gelling agent or a viscosity increasing agent. In this specification, the "stimulation-responsive" refers to that, the high viscosity material 130A keeps a high viscosity state or a gelation state since it is manufactured; however, when a specific stimulation is applied, the high viscosity material 130A is altered to have low viscosity, and liquefied (solated), and thereby returning to the state of the high surface energy liquid 130 described above. Once the high surface energy liquid 130 becomes a low viscosity liquid or sol, it is preferably not altered reversibly to a high viscosity liquid or gel.

That is, since the method for manufacturing an electrowetting element of the present invention employs a gelling agent or a viscosity increasing agent, which is stimulation-responsive, an electrowetting element can be manufactured efficiently and easily, and since the gelling agent or the viscosity increasing agent is stimulation-responsive, responsiveness of the electrowetting element can be increased efficiently and easily, by applying a specific stimulation to the gelling agent or the viscosity increasing agent.

In this specification, specific examples of stimulation include contact with a chemical substance, electromagnetic waves, such as ultraviolet light, visible light and infrared light, heat, sonic waves, shaking, an electric field, a magnetic field and the like. In particular, when stimulation is applied from outside of a cell, preferably the stimulation can act on a high viscosity liquid or a gel form of the high surface energy liquid 130 (the high viscosity material 130A) in the cell, by penetrating the first substrate 110 or the second substrate 120.

When a high viscosity liquid or gel is altered to a low viscosity liquid or sol by stimulation, the viscosity thereof is preferably 300 mPa·s or below, more preferably 100 mPa·s or below, and still more preferably 30 mPa·s or below.

When a gelling agent or a viscosity increasing agent is altered to have low viscosity, the stimulation applied to at least one of the first liquid material and the second liquid material is preferably contact with a chemical substance or irradiation with electromagnetic wave.

Among them, examples of response by contact with a chemical substance include responses by contact with the low surface energy liquid 131, and by contact with the pixel wall 127. More specifically, a gelling agent or a viscosity increasing agent is preferably dissolved in the low surface energy liquid 131. That is, if the high surface energy liquid 130 is gelated or altered to have high viscosity by a gelling agent or a viscosity increasing agent, and the gelling agent or the viscosity increasing agent is dissolved in the low surface energy liquid 131, when the high surface energy liquid 130, which is gelated or altered to have high viscosity, contacts to the low surface energy liquid 131, the gelling agent is dissolved in, and transferred to the low surface energy liquid 131, and thereby viscosity of the high surface energy liquid 130 is largely decreased. As described above, the high surface energy liquid 130, which is gel-like or in a high viscosity state at the time of steps, but is in a low viscosity state at the time of use, can be realized.

As such a gelling agent, hydrocarbons such as tetracosane, octacosane, dotriacontane, and hexatriacontane can be used; as the high surface energy liquid 130, alcohol such as methanol and ethanol, or mixtures of these alcohols and water can be used; as the low surface energy liquid 131, linear hydrocarbon such as octane, nonane, decane, undecane, and dodecane, or cyclic hydrocarbon such as cyclohexane can be used (Langmuir, Vol. 16, pp. 352, 2000).

In addition, a method in which a chemical substance such as acid, base, salt, oxidant, and reductant is contained in the low surface energy liquid 131, or is coated on the surface of the pixel wall 127, and when the low surface energy liquid 131 contacts the high surface energy liquid 130, the chemical substance is reacted with a gelling agent or a viscosity increasing agent to alter the high surface energy liquid to have low viscosity. Acid, base, and salt do not particularly act on the low surface energy liquid 131, but act on the high surface energy liquid 130 as dissolved and dissociated, and thus they can be effectively used.

Also, as an example of responses to external stimuli such as light is the gelling agent, in which cetyltrimethylammonium bromide (CTAB) and trans-ortho-methoxy cinnamic acid are combined (Journal of American Chemical Society, Vol. 129, No. 6, pp. 1553, 2007). This gelling agent gelates aqueous or polarity solvents in normal environments; however, when the gelling agent is irradiated with ultraviolet light by a mercury lamp or the like, it is isomerized to a cis isomer, and becomes a liquid having a relatively low viscosity.

In the present embodiment, regarding a viscosity increasing agent or a gelling agent which is responsive to contact with chemical substances, although the high surface energy liquid 130 starts to be altered to have low viscosity at a stage in which cells are formed as shown in FIG. 5 (b), heating, shaking and the like can also be performed if desired.

Figure 6:
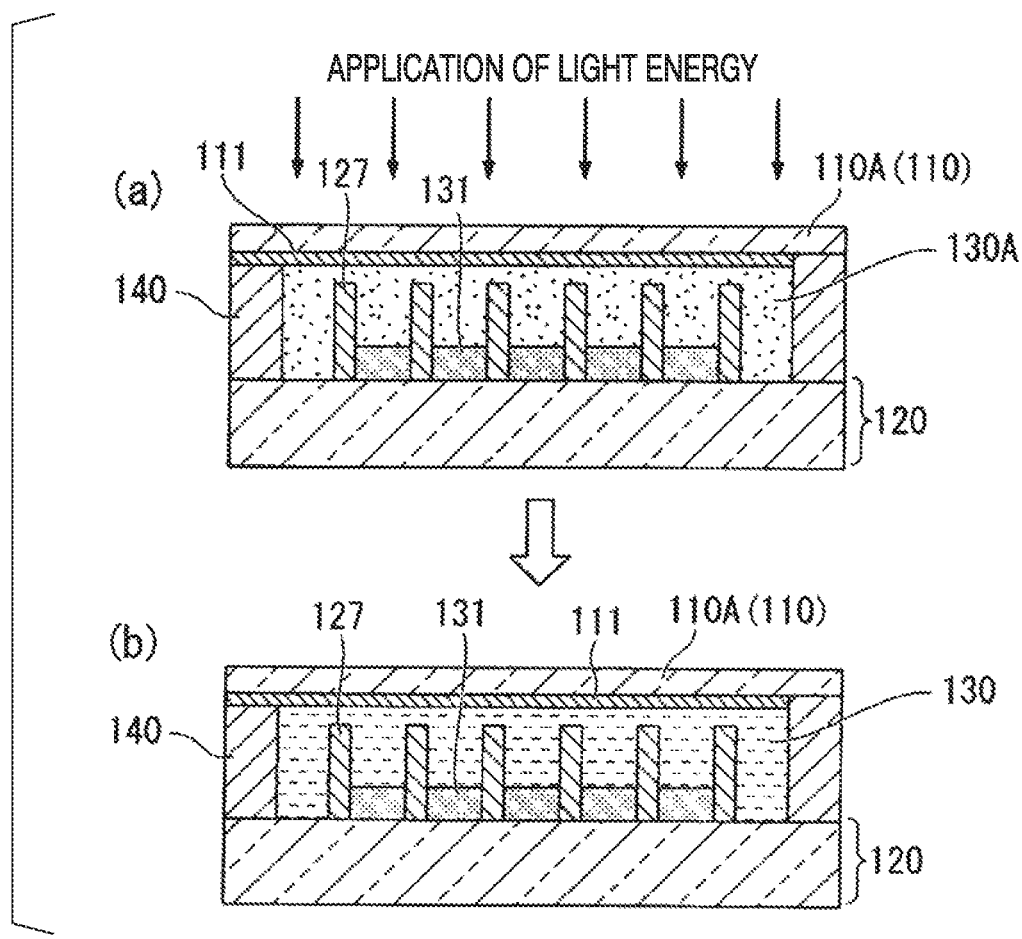
FIG. 6 explains the manufacturing step following FIG. 5.

On the other hand, when a viscosity increasing agent or a gelling agent which is responsive to light is used, as shown in FIG. 6 (a), the aforementioned stimulation was applied by applying light energy such as ultraviolet light, visible light, and infrared light as needed. In the present embodiment, light energy was applied from the first substrate 110 (the base material 110A) side. Since the base material 110A, which composes the first substrate 110, is composed of glass which is light permeable, light energy penetrates the first substrate 110, and the high viscosity material 130A filled inside of the first substrate 110 is well irradiated with the light energy. According to this, as shown in FIG. 6 (b), by altering the high viscosity material 130A for having low viscosity, it is altered to the state as the high surface energy liquid 130. Accordingly, the high surface energy liquid 130 can be placed well on the low surface energy liquid 131.

According to the present embodiment, the high viscosity material 130A consisting of a high viscosity or gel-like material, which is prepared by adjusting viscosity of the above-described high surface energy liquid 130 to 1 Pa·s or more, is used to bond the first substrate 110 and the second substrate 120. Since the high viscosity material 130A placed on the first substrate 110 is not fallen down even if it comes to the bottom side, the first substrate 110 and the second substrate 120 can be bonded easily by using the roll to roll method. Accordingly, even when large substrates are used as the first substrate 110 and the second substrate 120, manufacture can be performed efficiently and easily.

Note that, the method for placing the high viscosity material 130A on one surface of the first substrate 110 is not limited to the method described above, and for example, methods for coating in which roll coaters, die coaters or the like are used can also be used.

Also, either the step of placing the high viscosity material 130A on one surface of the first substrate 110, or the step of coating the low surface energy liquid 131 inside of the pixel G, which is surrounded by the pixel walls 127 of the second substrate 120, can be performed first, or the both steps can be performed at the same time.

(Second Embodiment)

Figure 7:
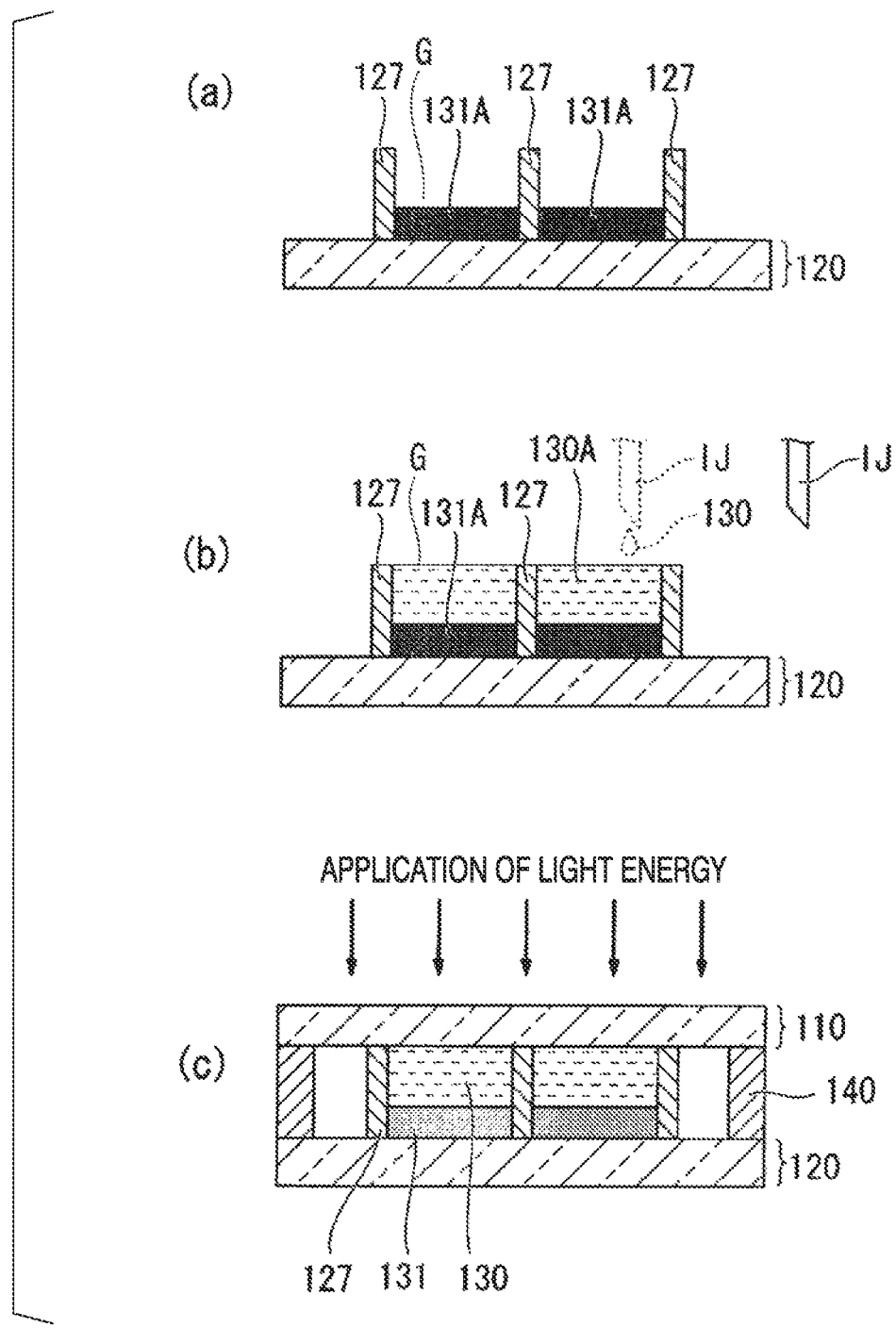
FIG. 7 shows the manufacturing step of the electrowetting display according to the second embodiment.

Hereinafter, the second manufacturing method of the above-described electrowetting display 100 will be explained as the second embodiment of the present invention. FIG. 7 shows the manufacturing step according to the present embodiment, and the common electrode 111 is not shown in the figure. Here, members which are identical between the present embodiment and the first embodiment have identical reference signs, and detailed explanations thereof are omitted or simplified.

In the manufacturing method according to the present embodiment, firstly, as shown in FIG. 3, the second substrate 120, which is manufactured by a conventional technique, is prepared, and the pixel walls 127 are formed on the second substrate 120. Then as shown in FIG. 7 (a), the high viscosity material 131A consisting of the low surface energy liquid 131, which is altered to have high viscosity of 1 Pa·s or more, is placed in each of the pixels G of the second substrate 120. Here, the high viscosity material 131A includes a material conditioned as gel-like, which is not flowed even when inverted. The high viscosity material 131A is stimulation-responsive, and it becomes the low surface energy liquid 131 when viscosity thereof is decreased by chemical or physical stimulations.

For placement of the high viscosity material 131A, known coating methods and printing methods can be suitably used. These placing method are not particularly limited, provided that the high viscosity material 131A can be placed in the pixel G by employing the method, and screen printing, flexo printing, a gravure printing method, a dispensing method and the like can be employed. As an example of placing methods as shown in FIG. 7, the ink-jet device IJ may be used.

When placing the high viscosity material 131A, the high viscosity material 131A may be placed as gel-like or in a high viscosity state, or it may be placed after heating the high viscosity material 131A to be altered to have low viscosity, or to be solated. Alternatively, the high viscosity material 131A dissolved in a volatile solvent may be filled in the pixel G, and then the volatile solvent may be volatilized by heating and the like to form a desired layer of the high viscosity material 131A.

Then, as shown in FIG. 7 (b), injecting the high surface energy liquid 130 onto the high viscosity material 131A, which is placed in compartment regions (the pixels G) of the pixel walls 127. In the present embodiment, the ink jet device IJ was used for the injection. Note that the method is not particularly limited, provided that the high surface energy liquid 130 can be injected into the pixel G, and as other methods, screen printing, flexo printing, a gravure printing method, a dispensing method and the like can be employed.

As stated, by making the low surface energy liquid 131 in a high viscosity state or gel-like, it is not lifted from the bottom surface of the pixel G due to vigorous influx of the high surface energy liquid 130, even when the high surface energy liquid 130 is poured from an upper side as described above, and thereby a stable electrowetting element can be manufactured.

The high viscosity material 131A which is gelated or altered to have high viscosity is advantageous at the time of manufacture when introducing the high surface energy liquid 130; however, when operating as an electrowetting element, it may be difficult to displace and deform the gel-like low surface energy liquid 131. Even if operating by applying high voltage, the displacement and deformation are not restored after canceling the voltage, and as a result, it may be difficult to operate as a display element by reversible alteration of the shape of the interface.

Therefore, the high viscosity material 131A used in the present embodiment, which is altered to have high viscosity or gelated, becomes a low viscosity liquid (specifically, becomes in the state of the low surface energy liquid 131) by the applied stimulation. Once the high viscosity material 131A becomes a low viscosity liquid or sol, it is preferably not altered reversibly to a high viscosity liquid or gel.

Examples of stimulation to be added include stimulation with various chemical substances such as polar material, acid, base, oxidant, and reductant; electromagnetic wave such as ultraviolet light, visible light, and infrared light; and physical stimuli such as heat, sonic waves, shaking, an electric field, and a magnetic field; but not limited thereto, as long as the high viscosity material 131A can be altered to the low surface energy liquid 131 having low viscosity by the method.

Substances used for stimulation with chemical substances is exemplified below; however, the present invention is not limited thereto, as long as the high viscosity material 131A can be altered to have low viscosity by the substances. Examples of a polar material, acid, and base used in the present invention include a compound having a hydroxyl group, an amino group or salts thereof, a carboxyl group or salts thereof, a sulfonic acid group or salts thereof, a phosphonic acid group or salts thereof, an amide bond, an urethane bond, an urea bond, a nitro group, a mercapto group, a phenol group and the like. Among them, a compound having a hydroxyl group and a compound having a carboxyl group, which are less corrosiveness, are preferable, and a compound having a hydroxyl group is more preferable.

Also, examples of oxidant used in the present invention include m-chloroperoxybenzoic acid, peracetic acid, hydrogen peroxide and the like.

In addition, an example of reductant used in the present invention is sodium borohydride.

Note that, in the present invention, stimulation with chemical substances is not limited to the contact with chemical substances which alters a gelling agent and the like by a reaction, and also include the contact with chemical substances by which a gelling agent is dissolved, and transferred to a phase containing these substances. When considering of stability of an electrowetting element, among chemical substances for stimulation in the present invention, chemical substances having responsiveness with dissolution and transfer are preferably used.

When physical stimuli are applied, preferably the stimulation can act on a high viscosity liquid or a gel form of the high viscosity material 131A in the cell, by penetrating the first substrate 110 or the second substrate 120.

When a high viscosity liquid or gel is altered to a low viscosity liquid or sol by stimulation, the viscosity thereof is preferably 300 mPa·s or below, more preferably 100 mPa·s or below, and still more preferably 30 mPa·s or below.

Among them, an example of a gelling agent or a viscosity increasing agent, which is dissolved or phase-transferred by response according to stimulation of chemical substances, is a gelling agent or a viscosity increasing agent by which the low surface energy liquid 131 is gelated or altered to have high viscosity, as well as which is dissolved in the high surface energy liquid 130. By using such a viscosity increasing agent, and being in the state shown in FIG. 7 (b), the gelling agent or the viscosity increasing agent is transferred from the 131A to the high surface energy liquid 130, and thereby the 131A becomes the low surface energy liquid 131, which has low viscosity. At this time, it can be warmed or shaken to promote transfer of the viscosity increasing agent. In addition, since the specific gravity of the low surface energy liquid 131 is generally lower than that of the high surface energy liquid 130, the low surface energy liquid 131 may be lifted when the viscosity increasing agent is transferred. Therefore, immediately after the state shown in FIG. 7 (b) is made, the first substrate 110 may be placed, and then the first substrate 110 may be placed on the bottom, and the second substrate 120 may be placed on the top.

Here, when dissolving the gelling agent or the viscosity increasing agent in the high surface energy liquid 130, it is important that the gelling agent or the viscosity increasing agent is more easily dissolved in the high surface energy liquid 130 than in the low surface energy liquid 131, and distributed. Although the solubility is not particularly limited, it is preferably 1% by weight or more, and more preferably 5% by weight or more. Although it is preferably dissolved at room temperature, it may be warmed as long as the manufacture is not disturbed.

Since the viscosity increasing agent is dissolved in the high surface energy liquid 130, the high surface energy liquid 130 is not altered to have high viscosity, and also, the high surface energy liquid 130 is not transferred back to the low surface energy liquid 131 to form the 131A again.

Specific examples of such the material by which the low surface energy liquid 131 is altered to have high viscosity or gelated, as well as which is dissolved in the high surface energy liquid 130, include hydroxycarboxylic acids such as 12-hydroxystearic acid; amides such as N-lauroyl-L-glutamic acid-α, γ-dibutylamide, and N-2-ethylhexyl-L-glutamate dibutylamide; tetradodecyl ammonium bromide; salts of substituted cinnamic acids and alkyl or aralkyl amines; a salt of 1,1-cyclobutane dicarboxylic acid and cyclohexyl amine; ammonium salts such as a salt of malonic acid and long-chain alkyl (for example hexadecyl) amine; polyvalent hydroxyl groups such as 1,3;2,4-dibenzylidene-D-sorbitol; polyvalent carboxylic acid ester such as butane-1,2,3,4-tetracarboxylic acid-dilauryl ester; amino acid surfactants; combined salts of di-2-ethylhexyl sulfosuccinate sodium salt with steroid compounds, phenols, hydroquinone, resorcinol or the like; a combined salt of trimethyl stearyl ammonium chloride with decanoic acid; esters of arjunolic acid; bis(alkyl-amidated amino acid) phthalamide; and alkyl-modified amino acid and the like, but not limited thereto as long as the material meets the object of the present invention.

Among them, an amino acid surfactant viscosity increasing or gelling agent is, for example, a gelling agent represented by the following general formula (1) (Colloid Polym. Sci. 276:252 (1998)).

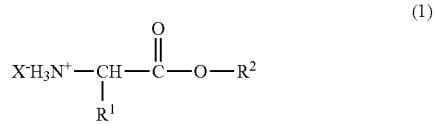

(1)

In the formula (1), $X^-$ represents a monovalent anion group. $R^1$ represents a monovalent substituent of 1 to 9 carbon atoms, and may contain any one selecting from the group consisting of oxygen, nitrogen and sulfur, and may contain a cyclic structure. $R^2$ represents a monovalent substituent of 1 to 20 carbon atoms.

The gelling agent of the formula (1) can be easily synthesized by dehydrating and condensing an amino acid having the structure of $R^1$ and an alcohol corresponding to an ester structure of $R^2$ under an acidic condition; and performing an ion exchange of $X^-$ if desired.

Although $X^-$ is not particularly limited, provided that it is a monovalent anion, a conjugate base of an acid having an aromatic group is preferable because it tends to have higher gelation ability. Specific examples of a conjugate base of an acid having an aromatic group include p-toluenesulfonate, benzenesulfonate, benzenephosphonate, benzoate and the like, but not limited thereto. Among them, p-toluenesulfonate is particularly preferable to use, because it does not require an ion exchange after synthesis, and is available in bulk with low-cost.

$R^1$ represents a monovalent substituent of 1 to 9 carbon atoms, and may contain any one selecting from the group consisting of oxygen, nitrogen and sulfur, and may contain a cyclic structure. The structure of $R^1$ depends on a structure of an amino acid used as a raw material. An amino acid used as a raw material is preferably D-form or L-form, and DL-form is not preferable because gelation ability thereof is lower.

Among these amino acids, an amino acid in which $R^1$ is an alkyl group is relatively stable to use, and thus preferable. Specific preferable examples of $R^1$ include a methyl group, an isopropyl group, an isobutyl group, a sec-butyl group, and a benzyl group, and synthesis can be performed when each of alanine, valine, leucine, isoleucine, and phenylalanine is used as a raw material respectively. Among them, a gelling agent in which $R^1$ is an isobutyl group, that is, leucine is used as a raw material, is preferably used because of suitable solubility and polarity thereof.

In addition, $R^2$ may be a monovalent substituent of 1 to 20 carbon atoms. In particular, a linear chain alkyl group of 6 to 20 carbon atoms can preferably used, because gel becomes highly stable, and synthesis is easy. Also, since a gel transition temperature of a gelling agent can be adjusted by adjusting the number of carbon atoms, it is important to choose and adjust lengths of carbon chains.

These amino acid surfactant-type gelling agents may be used alone, or used as combination of two or more thereof to adjust a gelation temperature and the like, and may also be used in combination with other kinds of gelling agents.

Also, a combined salt of di-2-ethylhexyl sulfosuccinate sodium salt with steroid compounds or phenols forms the semi-solid state 131A by gelating the low surface energy liquid 131 and is dissolved in the high surface energy liquid 130, and thus the combined salt can also be suitably used in the present invention (Shih-Huang Tung et al., Soft Matter, 2008, Vol. 4, pp. 1086).

Di-2-ethylhexyl sulfosuccinate sodium salt is a substance represented by the following formula (2), and is easily available.

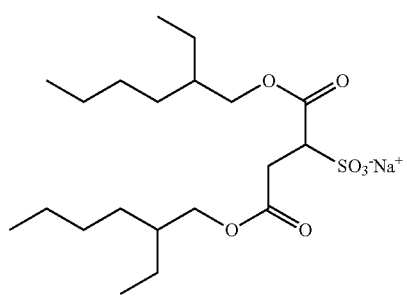

(2)

Di-2-ethylhexyl sulfosuccinate sodium salt can gelate a low surface energy liquid when used in combination with an additive, for example, a steroid compound such as sodium deoxycholate, or a phenolic compound such as cresol, amino phenol, hydroquinone, and resorcinol. An amount of the additive used with di-2-ethylhexyl sulfosuccinate sodium salt is represented by a ratio by weight to di-2-ethylhexyl sulfosuccinate sodium salt, and is preferably within a range of 1 to 150% by weight, more preferably within a range of 5 to 100% by weight, and still more preferably within a range of 10 to 50% by weight. Since physical properties of gel can be adjusted by kinds and amounts of additives to be used, a viscosity increasing agent or a gelling agent for general-purposes can be prepared.

In addition, salts of alkyl substituted cinnamic acid, such as 3-methyl cinnamic acid and 4-methyl cinnamic acid; halogen substituted cinnamic acid, such as 3-chloro cinnamic acid, 3-bromo cinnamic acid, 4-chloro cinnamic acid, and 4-bromo cinnamic acid; and nitro group substituted cinnamic acid, such as 4-nitro cinnamic acid; and long-chain alkylamine, such as hexadecylamine; alicyclic alkyl substituted amine, such as dicyclohexylamine; and aralkyl substituted amine, such as dibenzylamine can gelate the low surface energy liquid (for example, Crystal Growth & Design, Vol. 6, No. 9, pp. 2114, 2006). These salts are compounds having structures represented by the following general formula (3).

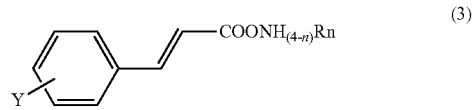

(3)

In the formula, n represents an integer of 1 to 3, R represents a monovalent organic group, and Y represents an optional monovalent substituent.

Examples of R, which represents a monovalent organic group, include aliphatic hydrocarbon of 6 to 20 carbon atoms, an aralkyl group and the like. Specific examples of aliphatic hydrocarbon of 6 to 20 carbon atoms include an n-hexyl group, an n-heptyl group, an n-octyl group, an n-nonyl group, an n-decyl group, an n-undecyl group, an n-dodecyl group, an n-tetradecyl group, an n-hexadecyl group, an n-octadecyl group, an n-eicosyl group, a cyclohexyl group, a cyclooctyl group and the like, but not limited thereto, and branched chains and the like may be contained. Among them, an n-hexadecyl group, an n-octadecyl group, and a cyclohexyl group are preferable. Specific examples of an aralkyl group include a benzyl group, a phenylethyl group, a naphthylmethyl group, a naphthylethyl group and the like, and among them, a benzyl group is preferable.

The Y, which represents an optional monovalent group, represents for example a lower alkyl group of 1 to 6 carbon atoms or a halogeno group. Specific examples of a lower alkyl group of 1 to 6 carbon atoms include a methyl group, an ethyl group, a propyl group, a butyl group, a pentyl group, a heptyl group and the like, and among them, a methyl group, an ethyl group, and a propyl group are preferable, and a methyl group is more preferable. Specific examples of a halogeno group include a fluoro group, a chloro group, a bromo group and the like, and among them, a chloro group or a bromo group are preferable.

Since these gelling agents or viscosity increasing agents may have surface activity, and may affect physical properties of the high surface energy liquid 130, an amount of the minimum requirement is preferably used. Although a concentration, which is deemed as an amount of the minimum requirement, is cannot be generalized because it is varied depending on kinds of the low surface energy liquid 131 and the high surface energy liquid 130, and a kind of a viscosity increasing agent to use, usually it is preferably from 0.001 to 10% by weight, and more preferably from 0.01 to 5% by weight to the low surface energy liquid 131.

Alternatively, a viscosity increasing agent having physical responsiveness can also preferably be used. The stilbene compound E-SGP represented by the following formula (4) is one of these stimulation-responsive gelling agents (Chem. Commun., 2004, pp. 1608-1609).

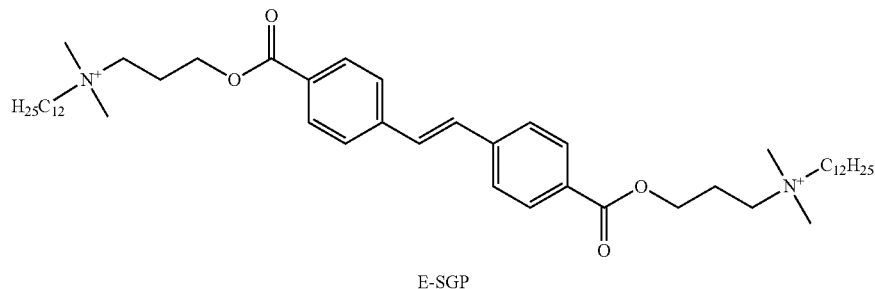

E-SGP (4)

This gelling agent becomes a solution by dissolving in an organic solvent (the low surface energy liquid 131) at a high temperature and is gelated by cooling it to a room temperature, and becomes a low viscosity liquid by irradiating with ultraviolet. Accordingly, by injecting and printing the gelling agent into a pixel at a high temperature with any method, and then by cooling it to a room temperature, the gelling agent becomes gel. At this time, by injecting the high surface energy liquid 130 into a pixel, followed by irradiating with ultraviolet, stilbene is isomerized and dimerized, and thereby it becomes a sol (liquid).

Also, a compound, in which cholesterol is bonded to azobenzene with an ester bond, gelates the low surface energy liquid 131, and is altered to have low viscosity when azobenzene is isomerized by light (J. Am. Chem. Soc., 1994, Vol. 116, pp. 6664).

In addition, a salt of 9-anthracenecarboxylic acid and aliphatic amine also gelates the low surface energy liquid 131, and by reacting (dimerizing) the positions 9 and 10 of anthracene with light, the gel becomes a low viscosity liquid (Org. Biomol. Chem., 2003, Vol. 1, pp. 2745). Since the raw materials, that is 9-anthracenecarboxylic acid and aliphatic amine, are easily available, and the salt can be easily synthesized, this gelling agent can preferably be used. The salt of 9-anthracenecarboxylic acid and aliphatic amine is dimerized by irradiation with light and become sol, and then the dimer is dissolved and transferred into the high surface energy liquid 130. Accordingly, the gelling agent consisting of the salt of 9-anthracenecarboxylic acid and aliphatic amine can preferably be used without possibility of re-gelation.

In the present embodiment, as shown in FIG. 7 (*c*), the first substrate 110 and the second substrate 120 are bonded through the sealing material 140. After that, the aforementioned stimulation was applied by providing light energy such as ultraviolet light, visible light, and infrared light as needed.

In the present embodiment, light energy was applied from the first substrate 110 (the base material 110A) side. Since the base material 110A, which composes the first substrate 110, is composed of glass which is light permeable, light energy penetrates the first substrate 110, and the high viscosity material 131A filled inside is well irradiated with the light energy. According to this, as shown in FIG. 7 (*c*), by altering the high viscosity material 131A for having low viscosity, it is altered to the state as the low surface energy liquid 131. Accordingly, the low surface energy liquid 131 and the high surface energy liquid 130 can be laminated well.

According to the present embodiment, since the high viscosity material 131A, in which the low surface energy liquid 131 described above is gelated or altered to have high viscosity of 1 Pa·s or more, is used, and the high surface energy liquid 130 is placed onto the high viscosity material 131A, laminate can be performed as preventing the 131 from lifting and moving between pixels, compared to when the low surface energy liquid 131 is used without any alterations, and thus the bonding step of the first substrate 110 and the second substrate 120 can be performed in a short time.

Accordingly, even when large substrates are used as the first substrate 110 and the second substrate 120, manufacture can be performed efficiently and easily. In addition, after cells are prepared, since the high viscosity material 131A is altered to the low surface energy material 131 having low viscosity by chemical or physical stimulation, it can be well operated as an electrowetting element.

(Third Embodiment)

Figure 8:
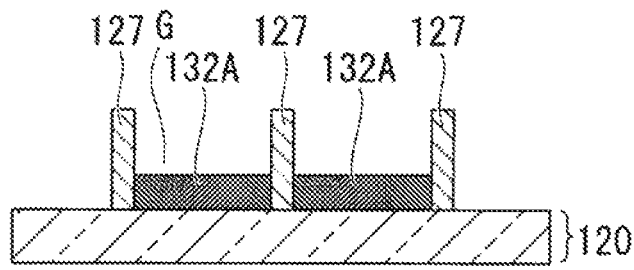
FIG. 8 shows the manufacturing step of the electrowetting display according to the third embodiment.
Figure 8:
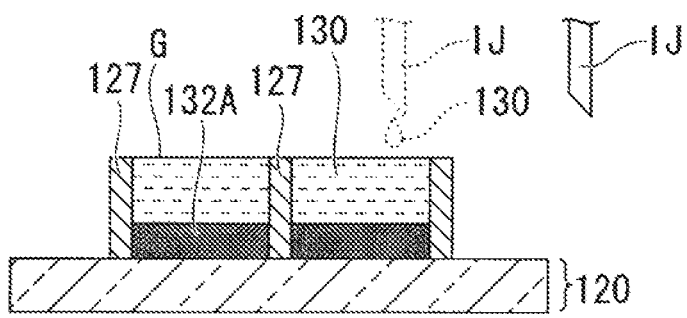
Figure 8:
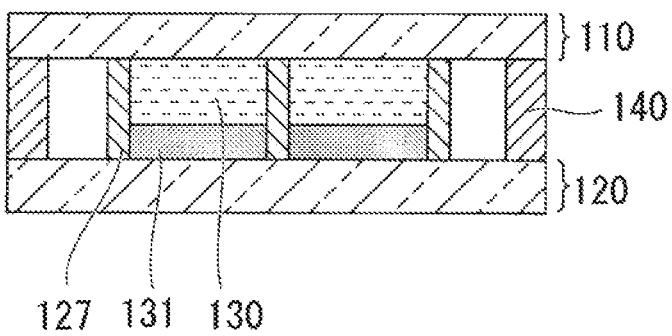

Hereinafter, the third manufacturing method of the above-described electrowetting display 100 will be explained as the third embodiment of the present invention. FIG. 8 shows the manufacturing step according to the present embodiment, and the common electrode 111 is not shown in the figure. Here, members which are identical among the present embodiment and the first and second embodiments have identical reference signs, and detailed explanations thereof are omitted or simplified.

In the manufacturing method according to the present embodiment, firstly, as shown in FIG. 3, the second substrate 120, which is manufactured by a conventional technique, is prepared, and the pixel walls 127 are formed on the second substrate 120. Then as shown in FIG. 8 (*a*), the mixed high viscosity material 132A is placed in each of the pixels G of the second substrate 120.

The mixed high viscosity material 132A consists of the high surface energy liquid 130 having a viscosity which is adjusted to 1 Pa·s or more, the low surface energy liquid 131, and a gelling agent or a viscosity increasing agent by which the high surface energy liquid 130 can be altered to have high viscosity. Here, the mixed high viscosity material 132A having viscosity of 1 Pa·s or more includes a material conditioned as gel-like, which is not flowed even when inverted.

Although the high surface energy liquid 130 and the low surface energy liquid 131 are not mixed together, when the high surface energy liquid 130 is altered to have high viscosity, the low surface energy liquid 131 can be dispersed. A viscosity increasing agent is a material which can be dissolved in the low surface energy liquid 131, and since gelation does not occur if an introducing amount of the low surface energy liquid 131 is excessive, the introducing amount of the low surface energy liquid 131 is suitably adjusted.

In the same manner of the second embodiment of the present invention, the ink-jet device IJ may be used for placing the mixed high viscosity material 132A. Note that the method is not particularly limited, provided that the mixed high viscosity material 132A can be placed into the pixel G, and as other methods, screen printing, flexo printing, a gravure printing method, a dispensing method and the like can be employed.

Then, as shown in FIG. 8 (b), injecting the high surface energy liquid 130 onto the mixed high viscosity material 132A, which is placed in compartment regions (the pixels G) of the pixel walls 127. Note that the method is not particularly limited, provided that the high surface energy liquid 130 can be injected into the pixel G, and in addition to injection with the ink-jet device IJ shown in FIG. 8 (b), screen printing, flexo printing, a gravure printing method, a dispensing method and the like can be employed.

As stated, by utilizing the mixed high viscosity material 132A, which contains the low surface energy liquid 131 and is in a high viscosity state or gel-like state, it is not lifted from the bottom surface of the pixel G due to vigorous influx of the high surface energy liquid 130, even when the high surface energy liquid 130 is poured from an upper side as described above, and thereby a stable electrowetting element can be manufactured.

When adding the high surface energy liquid 130 to the high viscosity material 132A, which is gelated or altered to have high viscosity, and being in the state shown in FIG. 8 (b), the high surface energy liquid 130 is inflowed into the mixed high viscosity material 132A, and thereby the viscosity of the high viscosity material 132A is decreased. Concurrently with decrease of the viscosity, a viscosity increasing agent is dissolved in the low surface energy liquid 131, and then alteration to low viscosity and separation are proceeded, and finally the high surface energy liquid 130 having low viscosity and the low surface energy liquid 131 are separated, which is a suitable state for operation of an electrowetting element. Finally obtained viscosity of the high surface energy liquid 130 and viscosity of the low surface energy liquid 131 are the same as those in the embodiments 1 and 2. At this time, in FIG. 8 (c), in which the first substrate is placed, the first substrate may be placed on the bottom side to prevent the low surface energy liquid 131 to be lifted.

Also in the present embodiment, re-gelation and re-alteration to high viscosity does not occur.

Specific examples of the viscosity increasing agent, by which the high surface energy liquid 130 is altered to have high viscosity or gelated, and which is dissolved in the low surface energy liquid 131 to form the mixed high viscosity material 132A of the high surface energy liquid 130 and the low surface energy liquid 131, include long-chain hydrocarbon materials, such as tetracosane, octacosane, dotriacontane, and hexatriacontane, but not limited thereto as long as the material meets the object of the present invention. These gelling agents are reported in the journal "Langmuir, 2000, Vol. 16, pp. 352."

Although the mixing ratio thereof is cannot be generalized because the concentration is varied depending on kinds of the high surface energy liquid 130 and the low surface energy liquid 131, and a kind of a viscosity increasing agent to use, usually an adding amount of the viscosity increasing agent is preferably from 0.001% by weight to 10% by weight, and more preferably from 0.01% by weight to 3% by weight to the high surface energy liquid 130. In addition, the ratio of the high surface energy liquid 130 and the low surface energy liquid 131 is preferably within a range from 3:1 to 30:1.

According to the present embodiment, since the mixed high viscosity material 132A consisting of a material having high viscosity or a gel-like material, in which the mixture of the low surface energy liquid 131 and the high surface energy liquid 130 described above is prepared to have high viscosity of 1 Pa·s or more, is used, and the high surface energy liquid 130 is placed onto the mixed high viscosity material 132A, the bonding step of the first substrate 110 and the second substrate 120 can be performed in a short time, as evenly placing the high surface energy liquid 130 and the low surface energy liquid 131. Accordingly, as shown in FIG. 8 (c), even when large substrates are used as the first substrate 110 and the second substrate 120, manufacture can be performed efficiently and easily.

In addition, since a small amount of hydrocarbons or the like can be used as a viscosity increasing agent, contamination of impurities and/or ions in the high surface energy liquid 130 and the low surface energy liquid 131 can be suppressed as much as possible, and this is the most distinctive feature of the third embodiment.

(Fourth Embodiment)

Figure 9:
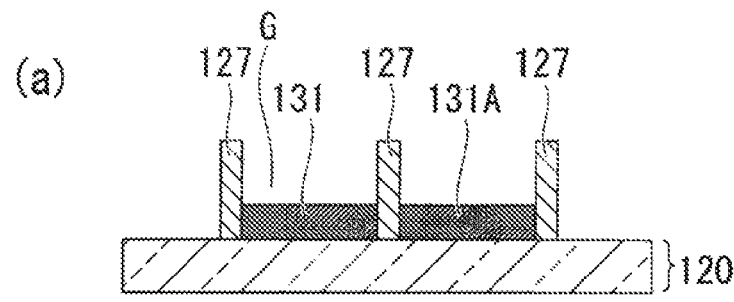
FIG. 9 shows the manufacturing step of the electrowetting display according to the fourth embodiment.
Figure 9:
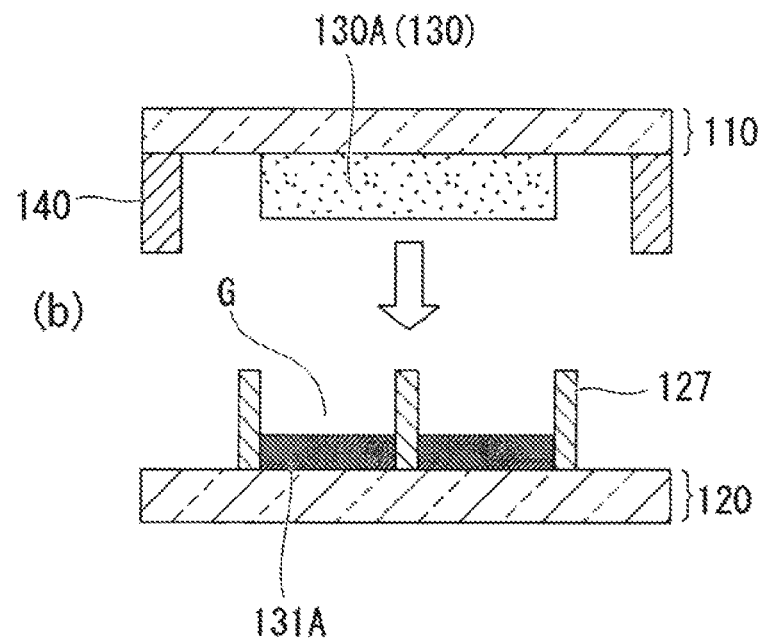
Figure 9:
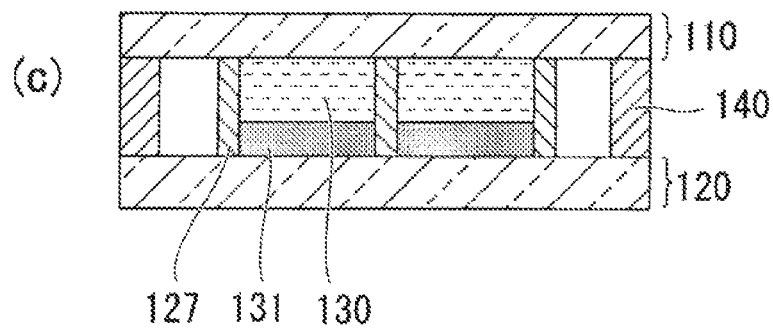

Hereinafter, the manufacturing method of the above-described electrowetting display 100 will be explained as the fourth embodiment of the present invention. FIG. 9 shows the manufacturing step according to the present embodiment, and the common electrode 111 is not shown in the figure. Here, members which are identical to those of the above-described embodiments have identical reference signs, and detailed explanations thereof are omitted or simplified.

In the manufacturing method according to the present embodiment, firstly, as shown in FIG. 3, the second substrate 120, which is manufactured by a conventional technique, is prepared, and the pixel walls 127 are formed on the second substrate 120. Then as shown in FIG. 9 (a), the high viscosity material 131A consisting of the low surface energy liquid 131, which is altered to have high viscosity of 1 Pa·s or more, or is gelated, is placed in each of the pixels G of the second substrate 120, in the same manner as in the second embodiment.

Then as shown in FIG. 9 (b), the first substrate 110 and the second substrate 120 are bonded through the high surface energy liquid 130. In the present embodiment, the high viscosity material 130A consisting of the high surface energy liquid 130, which is altered to have viscosity of 1 Pa·s or more, or is gelated, is placed inside of the first substrate 110 which contains the sealing material 140, and the first substrate 110 and the second substrate 120 are bonded through the high viscosity material 130A in the same manner as the first embodiment. At the time of bonding, to prevent influx of air bubble and the like, a bonding angle may be adjusted, or bonding may be performed under substantially vacuum.

As stated, the high viscosity material 130A, in which the high surface energy liquid 130 is altered to have high viscosity or is gelated, is placed on the first substrate 110; the first substrate 110 is turned upside down; and the first substrate 110 and the second substrate 120 are bonded through the sealing material 140. At this time, since the high viscosity material 130A is in a high viscosity state, the thickness thereof is not largely changed even when the high viscosity material 130A is turned upside down.

Also, the high viscosity material 130A may be coated by a known method on the second substrate 120, on which the high viscosity material 131A is placed, and then the first substrate 110 may be bonded thereon.

In the present embodiment, a stimulation-responsive material which responds to chemical stimuli and/or physical stimuli is also used as a viscosity increasing agent or a gelling agent.

When the viscosity increasing agent that can be dissolved in the low surface energy liquid 131 is used for the high viscosity material 130A, and the viscosity increasing agent that can be dissolved in the 130 is used for the high viscosity material 131A, each viscosity increasing agent starts to be transferred to each of other layers in the state of FIG. 9 (c), and alteration to low viscosity is started. Heating or shaking may be applied to promote transfer of the viscosity increasing agent.

When a gelling agent or a viscosity increasing agent is light-responsive, also in the present embodiment, the first substrate 110 and the second substrate 120 are bonded to be in the state of FIG. 9 (c), and then light energy which can act by penetrating the first substrate 110 or the second substrate 120 is applied to the high viscosity material 130A or the high viscosity material 131A in the cells.

In the present embodiment, light energy was applied from the first substrate 110 side as needed. The light energy penetrates the base material 110A, which composes the first substrate 110, and the high viscosity material 130A and the high viscosity material 131A filled inside are well irradiated with the light energy. According to this, by altering the high viscosity material 130A and the high viscosity material 131A for having low viscosity, each of them is altered to the high surface energy liquid 130 and the low surface energy liquid 131 respectively. Accordingly, the structure in which the high surface energy liquid 130 is successfully placed on the low surface energy liquid 131 can be obtained.

According to the present embodiment, the high viscosity material 130A and the high viscosity material 131A consisting of high viscosity or gel-like materials, each of which is prepared by adjusting viscosity of the above-described high surface energy liquid 130 and viscosity of the above-described low surface energy liquid 131 respectively to 1 Pa·s or more, are used to bond the first substrate 110 and the second substrate 120. Since the high viscosity material 130A placed on the first substrate 110 does not fallen off even if it comes to the bottom side, the first substrate 110 and the second substrate 120 can be bonded easily by using the roll to roll method. Also, since dripping of liquids are hardly occurred if the high surface energy liquid 130 and the low surface energy liquid 131 are in high viscosity states, the first substrate 110 and the second substrate 120 can be handled easily at the time of bonding, and the bonding step of substrates can be performed in a short time. Accordingly, even when large substrates are used as the first substrate 110 and the second substrate 120, manufacture can be performed efficiently and easily.

(Fifth Embodiment)

Figure 10:
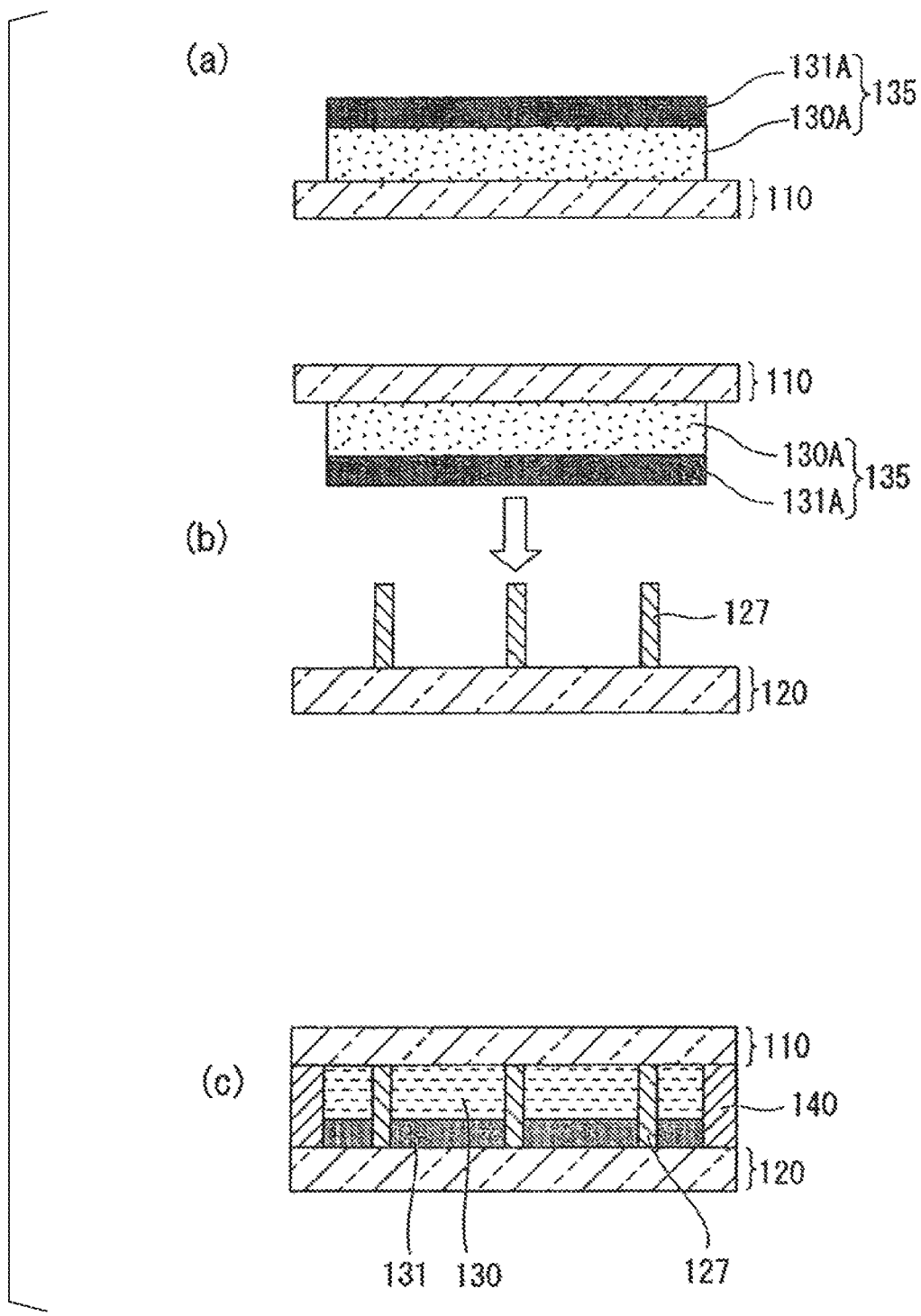
FIG. 10 shows the manufacturing step of the electrowetting display according to the fifth embodiment.

Hereinafter, the manufacturing method of the above-described electrowetting display 100 will be explained as the fifth embodiment of the present invention. FIG. 10 shows the manufacturing step according to the present embodiment, and the common electrode 111 is not shown in the figure. Here, members which are identical to those of the above-described embodiments have identical reference signs, and detailed explanations thereof are omitted or simplified.

In the manufacturing method according to the present embodiment, firstly, as shown in FIG. 3, the second substrate 120, which is manufactured by a conventional technique, is prepared, and the pixel walls 127 are formed on the second substrate 120.

In the present embodiment, then as shown in FIG. 10 (a), the physical stimulation-responsive (light-responsive) laminate 135, which consists of the laminate of the high viscosity materials 130A and 131A according to the embodiment described above, is placed on the first substrate 110. As described above, the high viscosity materials 130A and 131A are high viscosity or gel-like materials, each of which is prepared by adjusting viscosity of the high surface energy liquid 130 and viscosity of the low surface energy liquid 131 respectively to 1 Pa·s or more. Note that the laminate 135 may be formed directly on the first substrate 110, or may be formed on another substrate, and then transferred onto the first substrate 110. In the present embodiment, the laminate 135 was formed on another substrate (not shown in the figures), and then transferred onto the first substrate 110. By transferring the laminate 135 onto the first substrate 110 as stated, the bonding step of the first substrate 110 and the second substrate 120, which will be described below, can be easily performed. In addition, a film-like, or a plate-like base material may be used as a substrate for the laminate 135.

As stated, by using the laminate 135 in which the high surface energy liquid 130 and the low surface energy liquid 131 are altered to have high viscosity or are gelated, the first substrate 110 on which the laminate 135 is placed is turned upside down, and the first substrate 110 and the second substrate 120 are bonded through the sealing material 140 as shown in FIG. 10 (b). At this time, since the laminate 135 is in a high viscosity state, the thickness thereof is not largely changed even when the high viscosity material 130A is turned upside down.

Then as shown in FIG. 10 (c), in the present embodiment, after the first substrate 110 and the second substrate 120 are bonded, the light energy which can act by penetrating the first substrate 110 or the second substrate 120 is applied to the laminate 135 (the high viscosity materials 130A and 131A) in the cells, as needed.

In the present embodiment, light energy is applied from the first substrate 110 side. The light energy penetrates the base material 110A, which composes the first substrate 110, and the laminate 135 (the high viscosity materials 130A and 131A) filled inside are well irradiated with the light energy. According to this, by altering the high viscosity materials 130A and 131A for having low viscosity, each of them is altered to the high surface energy liquid 130 and the low surface energy liquid 131 respectively. Accordingly, the structure in which the high surface energy liquid 130 is successfully placed on the low surface energy liquid 131 can be obtained.

According to the present embodiment, since the laminate 135, which consists of the high surface energy liquid 130 and the low surface energy liquid 131, having a viscosity which is adjusted to 1 Pa·s or more, is used to bond the first substrate 110 and the second substrate 120, the high surface energy liquid 130 and the low surface energy liquid 131 can be evenly placed, and the bonding of the first substrate 110 and the second substrate 120 can be performed in a short time.

Accordingly, even when large substrates are used as the first substrate 110 and the second substrate 120, manufacture can be performed efficiently and easily.

Note that, in the present embodiment, although the case in which the laminate 135 is transferred onto the first substrate 110, and then the first substrate 110 and the second substrate 120 are bonded is explained as an example, the laminate 135 may be transferred to the second substrate 120 side, and then the first substrate 110 and the second substrate 120 may be bonded. In this case, as different from FIG. 9 (b), the pixel walls 127 may be provided on the first substrate 110 side.

Hereinafter, specific embodiments will be explained. The present invention is not limited thereto, and changes can be made within a range without departing from the purpose of the invention. Note that solvents and reagents used were manufactured by Wako Pure Chemical Industries, Ltd., unless otherwise specified, and were used without any particular purifications.

Example 1

Firstly, the second substrate 120 manufactured by a conventional technique was prepared. The surface of the second substrate was made to be water-repellent with the Teflon (registered trademark) solution: AF1600 (manufactured by E. I. du Pont de Nemours and Company) by a spin coat method. The thickness of the water-repellent layer was adjusted to 1 μm. The pixel walls 127 having heights of 20 μm and widths of 10 μm were formed on the second substrate 120 by using the photoresist: SU-8 (manufactured by Kayaku MicroChem Corporation) to prepare the structure shown in FIG. 3. The interval of the pixel walls was 80 μm. This was equivalent to a resolution of about 300 pixel per one inch.

A pigment mixture, in which carbon black having a hydrophobic surface is dissolved in undecane at a concentration of 5 wt %, was used as the low surface energy liquid 131 for the second substrate 120 on which the pixel walls 127 were formed. The aforementioned undecane solution of carbon black was diluted to 5-fold volume with hexane, and was filled in the second substrate 120 on which the pixel walls 127 were formed as shown in FIG. 4, and then hot air of 60° C. was blown to volatilize hexane, so that the low surface energy liquid 131 having a thickness of 4 μm was formed.

Meanwhile, as the light hardenability sealing material 140, the A785 (manufactured by SEKISUI CHEMICAL CO. LTD.) was coated by a dispenser along the circumference of the common electrode 111 side of the first substrate 110, so as to form a seal pattern.

An aqueous solution, in which 60 mM cetyltrimethylammonium bromide and 50 mM trans-ortho-methoxy cinnamic acid (manufactured by Sigma-Aldrich Corporation) were dissolved by heating, was cooled to make it gel-like, and was coated as the high viscosity material 130A, in the seal pattern, on one surface of the base material 110A of the first substrate 110, with a coating thickness of 100 μm by using a knife coater.

Then as shown in FIG. 5, the first substrate 110, on which the high viscosity material 130A was placed, and the second substrate 120 were bonded. At this time, an air vent hole was formed on a portion of the sealing material 140, and after ejecting excess air, it was sealed with the same sealing material.

After that, as shown in FIG. 6, irradiation with light of 1000 mJ by a ultra-high pressure mercury lamp having a center wavelength of 365 nm was applied, and thereby the sealing material 140 was cured, as well as the high viscosity material 130A was liquefied, thereby obtaining the electrowetting display 100.

The electrowetting display 100 obtained in the step described above was checked with a microscope, and it was confirmed that the low surface energy liquid 131 was evenly stored in the pixel G, which was surrounded by the pixel walls 127. When pulse voltage of 0 V/30 V with 30 Hz was applied to the pixel electrode 124 of the electrowetting display 100, the shape of the interface between the low surface energy liquid 131 and the high surface energy liquid 130 was changed by responding to increase and decrease of voltage, and open and closure of the pixel region as shown in FIG. 2 were observed.

Example 2

The second substrate 120 manufactured by a conventional technique was prepared. The surface of the second substrate was made to be water-repellent with a method in the same manner as that of Example 1. The thickness of the water-repellent layer was adjusted to 1 μm. The pixel walls 127 were formed on the second substrate 120 in the same manner as Example 1, to prepare the structure shown in FIG. 3.

A pigment mixture, in which carbon black having a hydrophobic surface is dissolved in undecane at a concentration of 5 wt %, was used as the low surface energy liquid 131 for the second substrate 120 on which the pixel walls 127 were formed. To the aforementioned undecane solution of carbon black, that is, to the low surface energy liquid 131, 4% by weight of the stilbene compound E-SGP and 0.2% by weight of N,N-dimethyl dodecyl amine were added and heated to 120° C. The heated low surface energy liquid 131 was discharged into the pixel G with an ink-jet device. After that, the second substrate 120 was cooled to room temperature, and the low surface energy liquid 131 was gelated to obtain the high viscosity material 131A.

A seal pattern was formed around the second substrate with the sealing material 140 (A785 (manufactured by SEKISUI CHEMICAL CO., LTD.)). The high surface energy liquid 130 was injected into the seal pattern. Since the high viscosity material 131A was gelated, it was not lifted or departed from the pixel even when the high surface energy liquid 130 was injected.

After that, irradiation with light of 1000 mJ by a ultra-high pressure mercury lamp having a center wavelength of 365 nm was applied, and thereby the sealing material 140 was cured, as well as the high viscosity material 131A was liquefied, thereby obtaining the electrowetting display 100.

The electrowetting display 100 obtained in the step described above was checked with a microscope, and it was confirmed that the low surface energy liquid 131 was evenly stored in the pixel G, which was surrounded by the pixel walls 127. When pulse voltage of 0 V/30 V with 30 Hz was applied to the pixel electrode 124 of the electrowetting display 100, the shape of the interface between the low surface energy liquid 131 and the high surface energy liquid 130 was changed by responding to increase and decrease of voltage, and open and closure of the pixel region as shown in FIG. 2 were observed.

Example 3

The second substrate 120 manufactured by a conventional technique was prepared. The surface of the second substrate was made to be water-repellent with a method in the same manner as that of Example 1. The thickness of the water-repellent layer was adjusted to 1 μm. The pixel walls 127 were formed on the second substrate 120 in the same manner as Example 1, to prepare the structure shown in FIG. 3.

In the same manner as Example 2, the high viscosity material 131A, in which the low surface energy liquid 131 was gelated, was prepared on the second substrate 120 on which the pixel walls 127 were formed. Meanwhile, a seal pattern was formed on the first substrate 110, in the same manner as Example 1.

In the same manner as Example 1, the high viscosity material 130A in which the high surface energy liquid 130 was gelated was formed in the seal pattern, and was bonded with the second substrate 120. At this time, an air vent hole was formed on a portion of the sealing material 140, and after ejecting excess air, it was sealed with the same sealing material.

After that, irradiation with light of 1000 mJ by a ultra-high pressure mercury lamp having a center wavelength of 365 nm was applied, and thereby the sealing material 140 was cured, as well as the high viscosity materials 130A and 131A were liquefied, thereby obtaining the electrowetting display 100 was obtained.

The electrowetting display 100 obtained in the step described above was checked with a microscope, and it was confirmed that the low surface energy liquid 131 was evenly stored in the pixel G, which was surrounded by the pixel walls 127. When pulse voltage of 0 V/30 V with 30 Hz was applied to the pixel electrode 124 of the electrowetting display 100, the shape of the interface between the high surface energy liquid 130 and the low surface energy liquid 131 was changed by responding to increase and decrease of voltage, and open and closure of the pixel region as shown in FIG. 2 were observed.

Example 4

The second substrate 120 manufactured by a conventional technique was prepared. The surface of the second substrate was made to be water-repellent with a method in the same manner as that of Example 1. The pixel walls 127 were formed on the second substrate 120 in the same manner as Example 1, to prepare the structure shown in FIG. 3.

Meanwhile, a seal pattern was formed on the first substrate 110, in the same manner as Example 1. In addition, meanwhile, the 130A, in which the high surface energy liquid 130 was gelated, was coated on a polyethylene terephthalate film with a thickness of 20 μm. 4 μm of the 131A, in which the low surface energy liquid 131 was gelated, was coated on the high surface energy liquid 130, thereby forming the laminate 135 described above.

The film (the laminate 135) on which the gel was coated was transferred onto the first substrate 110, and then the first substrate 110 and the second substrate 120 were bonded through the film. At this time, an air vent hole was formed on a portion of the sealing material 140, and after ejecting excess air, it was sealed with the same sealing material.

After that, irradiation with light of 1000 mJ by a ultra-high pressure mercury lamp having a center wavelength of 365 nm was applied, and thereby the sealing material 140 was cured, as well as the high surface energy liquids 130 and 131 were liquefied, thereby obtaining the electrowetting display 100.

The electrowetting display 100 obtained in the step described above was checked with a microscope, and it was confirmed that the low surface energy liquid 131 was evenly stored in the pixel G, which is surrounded by the pixel walls 127. When pulse voltage of 0 V/30 V with 30 Hz was applied to the pixel electrode 124 of the electrowetting display 100, the shape of the interface between the low surface energy liquid 131 and the high surface energy liquid 130 was changed by responding to increase and decrease of voltage, and open and closure of the pixel region as shown in FIG. 2 were observed.

Example 5

The second substrate 120 manufactured by a conventional technique was prepared. The surface of the second substrate was made to be water-repellent with a method in the same manner as that of Example 1. The thickness of the water-repellent layer was adjusted to 1 μm. The pixel walls 127 were formed on the second substrate 120 in the same manner as Example 1, to prepare the structure shown in FIG. 3.

A pigment mixture, in which carbon black having a hydrophobic surface is dissolved in cyclohexane at a concentration of 5% by weight, was used as the low surface energy liquid 131 for the second substrate 120 on which the pixel walls 127 were formed. To the aforementioned cyclohexane solution of carbon black, 0.3% by weight of 9-anthracenecarboxylic acid decyl ammonium salt (synthesized by ourselves) was added and heated to 80° C. The heated low surface energy liquid 131 was discharged into the pixel G with an ink-jet device. After that, the second substrate 120 was cooled to room temperature, and the low surface energy liquid 131 was gelated to obtain the high viscosity material 131A.

A seal pattern was formed around the second substrate with the sealing material 140 (A785 (manufactured by SEKISUI CHEMICAL CO., LTD.)). The high viscosity material 131A was injected into the seal pattern. Since the high viscosity material 131A was gelated, it was not lifted or departed from the pixel even when the high surface energy liquid 130 was injected.

Then as shown in FIG. 7 (c), the first substrate 110 and the second substrate 120 were bonded through the sealing material 140.

After that, irradiation with light of 1000 mJ by a ultra-high pressure mercury lamp having a center wavelength of 365 nm was applied, and thereby the sealing material 140 was cured. The high viscosity material 131A was liquefied, thereby obtaining the electrowetting display 100.

The electrowetting display 100 obtained in the step described above was observed under a microscope, and it was confirmed that the low surface energy liquid 131 was evenly stored in the pixel G, which was surrounded by the pixel walls 127. When pulse voltage of 0 V/30 V with 30 Hz was applied to the pixel electrode 124 of the electrowetting display 100, the shape of the interface between the low surface energy liquid 131 and the high surface energy liquid 130 was changed by responding to increase and decrease of voltage, and open and closure of the pixel region as shown in FIG. 2 were observed.

Example 6

The second substrate 120 manufactured by a conventional technique was prepared. The surface of the second substrate was made to be water-repellent with a method in the same manner as that of Example 1. The thickness of the water-repellent layer was adjusted to 1 μm. The pixel walls 127 were formed on the second substrate 120 in the same manner as Example 1, to prepare the structure shown in FIG. 3.

A solution of 95% ethanol and 5% water in which 0.04 M tetracosane was dissolved by heating, was cooled to obtain an opaque gel-like form, and was coated as the high viscosity material 130A, in the seal pattern, on one surface of the base material 110A of the first substrate 110, with a coating thickness of 100 μm by using a knife coater.

A pigment mixture, in which carbon black having a hydrophobic surface was dissolved in undecane at a concentration of 5% by weight, was used as the low surface energy liquid 131, and was placed in the pixel of the second substrate by using an ink-jet device.

Then as shown in FIG. 5, the first substrate 110, on which the high viscosity material 130A was placed, and the second substrate 120 were bonded. At this time, an air vent hole was formed on a portion of the sealing material 140, and after ejecting excess air, it was sealed with the same sealing material.

After that, the substrate was warmed to 50° C., and thereby the high viscosity material 130A was liquefied and the electrowetting display 100 was obtained.

The electrowetting display 100 obtained in the step described above was observed under a microscope, and it was confirmed that the low surface energy liquid 131 was evenly stored in the pixel G, which was surrounded by the pixel walls 127. When pulse voltage of 0 V/30 V with 30 Hz was applied to the pixel electrode 124 of the electrowetting display 100, the shape of the interface between the 131 and the 130 was changed by responding to increase and decrease of voltage, and open and closure of the pixel region as shown in FIG. 2 were observed.

Example 7

The second substrate 120 manufactured by a conventional technique was prepared. The surface of the second substrate was made to be water-repellent with a method in the same manner as that of Example 1. The thickness of the water-repellent layer was adjusted to 1 μm. The pixel walls 127 were formed on the second substrate 120 in the same manner as Example 1, to prepare the structure shown in FIG. 3.

A pigment mixture, in which carbon black having a hydrophobic surface is dissolved in cyclohexane at a concentration of 5 wt %, was used as the low surface energy liquid 131 for the second substrate 120 on which the pixel walls 127 were formed. The low surface energy liquid 131, in which 5% by weight of 12-hydroxy stearic acid was added to the aforementioned cyclohexane solution of carbon black, and heated at 70° C., was discharged into the pixel G with an ink-jet device. After that, the second substrate 120 was cooled to room temperature, and the low surface energy liquid 131 was gelated to obtain the high viscosity material 131A.

A seal pattern was formed around the second substrate with the sealing material 140 (A785 (manufactured by SEKISUI CHEMICAL CO., LTD.)). As the high surface energy liquid 130, a mixture of 95% ethanol and 5% water was injected into the seal pattern. Since the high viscosity material 131A was gelated, it was not lifted or departed from the pixel even when the high surface energy liquid 130 was injected.

Then as shown in FIG. 7 (c), the first substrate 110 and the second substrate 120 were bonded through the sealing material 140.

After that, when the second substrate was positioned at the top side to prevent the low surface energy liquid 131 to be lifted, and left for 30 minutes at a room temperature, the high viscosity material 131A was liquefied, and thus the electrowetting display 100 was obtained.

The electrowetting display 100 obtained in the step described above was checked with a microscope, and it was confirmed that the low surface energy liquid 131 was evenly stored in the pixel G, which was surrounded by the pixel walls 127. When pulse voltage of 0 V/30 V with 30 Hz was applied to the pixel electrode 124 of the electrowetting display 100, the shape of the interface between the low surface energy liquid 131 and the high surface energy liquid 130 was changed by responding to increase and decrease of voltage, and open and closure of the pixel region as shown in FIG. 2 were observed.

Example 8

The second substrate 120 manufactured by a conventional technique was prepared. The surface of the second substrate was made to be water-repellent with a method in the same manner as that of Example 1. The thickness of the water-repellent layer was adjusted to 1 μm. The pixel walls 127 were formed on the second substrate 120 in the same manner as Example 1, to prepare the structure shown in FIG. 3.

A pigment mixture, in which carbon black having a hydrophobic surface is dissolved in cyclohexane at a concentration of 5 wt %, was used as the low surface energy liquid 131. A mixture of 95% ethanol and 5% water was used as the high surface energy liquid 130. Tetracosane was used as the viscosity increasing agent.

To the high surface energy liquid 130, 2% by weight of the viscosity increasing agent was added, and mixed at 80° C. as stirring vigorously, and then 20% of the low surface energy liquid 131 was added to the high surface energy liquid 130, and further stirred. The obtained clouded liquid was poured into the pixel G of the second substrate, and kept it at a room temperature to obtain the mixed high viscosity liquid 132A having black color. The high surface energy liquid 130 was injected into the seal pattern of the second substrate. Since the mixed high viscosity liquid 132A was gelated, it was not lifted or departed from the pixel even when the high surface energy liquid 130 was injected.

Then as shown in FIG. 8 (c), the first substrate 110 and the second substrate 120 were bonded through the sealing material 140.

After that, when the second substrate was positioned at the top side to prevent the low surface energy liquid 131 to be lifted, and left for 30 minutes at 50° C., the mixed high viscosity liquid 132A was liquefied, and thus the electrowetting display 100 was obtained.

The electrowetting display 100 obtained in the step described above was checked with a microscope, and it was confirmed that the low surface energy liquid 131 was evenly stored in the pixel G, which was surrounded by the pixel walls 127. When pulse voltage of 0 V/30 V with 30 Hz was applied to the pixel electrode 124 of the electrowetting display 100, the shape of the interface between the 131 and the 130 was changed by responding to increase and decrease of voltage, and open and closure of the pixel region as shown in FIG. 2 were observed.

Example 9

(Synthesis of Gelling Agent)

In a 200 mL-eggplant shaped flask, 3.29 g (25 mmol) of L-leucine, 9.34 g (50 mmol) of 1-dodecanol, 5.71 g (30 mmol) of p-toluenesulfonic acid, and 60 mL of toluene were added. A dehydration device was placed, and the solution was vigorously refluxed for 6 hours in an oil bath of 140° C. The reaction mixture was cooled, and the solvent was vacuum distilled, and then an obtained solid was recrystallized with cyclohexane, followed by acetone. The fibrous crystal obtained was 9.0 g, and the yield was 76%. A structure and purity were confirmed by nuclear magnetic resonance spectrum (ECX-400, manufactured by JEOL Ltd.).

(Preparation and Evaluation of Display Cell)

The second substrate 120 manufactured by a conventional technique was prepared. The surface of the second substrate was made to be water-repellent with a method in the same manner as that of Example 1. The thickness of the water-repellent layer was adjusted to 1 μm. The pixel walls 127 were formed on the second substrate 120 in the same manner as Example 1, to prepare the structure shown in FIG. 3.

A pigment mixture, in which carbon black having a hydrophobic surface is dissolved in octane at a concentration of 5 wt %, was used as the low surface energy liquid 131 for the second substrate 120 on which the pixel walls 127 were formed. To the aforementioned octane solution of carbon black, 1% by weight of a synthesized gelling agent (dodecyl-(s)-2-ammonium-2-isobutyl acetate, p-toluenesulfonate) was added, and heated and stirred at 80° C. to make it an even liquid. This gelling agent-containing low surface energy liquid 131 was discharged into the pixel G with an ink-jet device as keep it heated. After that, the second substrate 120 was cooled to room temperature, and the low surface energy liquid 131 was gelated to obtain the high viscosity material 131A.

A seal pattern was formed around the second substrate with the sealing material 140 (A785 (manufactured by SEKISUI CHEMICAL CO., LTD.)). As the high surface energy liquid 130, methanol (manufactured by Wako Pure Chemical Industries, Ltd.) was injected into the seal pattern. Since the high viscosity material 131A was gelated, it was not lifted or departed from the pixel even when the high surface energy liquid 130 was injected.

Then as shown in FIG. 7 (*c*), the first substrate 110 and the second substrate 120 were bonded through the sealing material 140.

After that, when the second substrate was positioned at the top side to prevent the low surface energy liquid 131 to be lifted, and left for 30 minutes at a room temperature, the high viscosity material 131A was liquefied to become the low surface energy liquid 131, and thus the electrowetting display 100 was obtained.

The electrowetting display 100 obtained in the step described above was checked with a microscope, and it was confirmed that the low surface energy liquid 131 was evenly stored in the pixel G, which was surrounded by the pixel walls 127. When pulse voltage of 0 V/30 V with 30 Hz was applied to the pixel electrode 124 of the electrowetting display 100, the shape of the interface between the low surface energy liquid 131 and the high surface energy liquid 130 was changed by responding to increase and decrease of voltage, and open and closure of the pixel region as shown in FIG. 2 were observed.

Example 10

(Synthesis of Gelling Agent)

The gelling agent was synthesized in the same manner as Example 9, except that 12.15 g (50 mmol) of 1-hexadecanol was used as an alcohol. The fibrous crystal obtained was 9.4 g, and the yield was 67%.

(Preparation and Evaluation of Display Cell)

The display cell was synthesized in the same manner as Example 9, except that the gelling agent (hexadecyl-(s)-2-ammonium-2-isobutyl acetate, p-toluene sulfonate) synthesized as described above was used. In the same manner as Example 9, since the high viscosity material 131A was gelated with the gelling agent, it was not lifted or departed from the pixel even when the high surface energy liquid 130 was injected.

Then the electrowetting display 100 was prepared in the same manner as Example 9.

The obtained electrowetting display 100 was checked with a microscope, and it was confirmed that the low surface energy liquid 131 was evenly stored in the pixel G, which is surrounded by the pixel walls 127. When pulse voltage of 0 V/30 V with 30 Hz was applied to the pixel electrode 124 of the electrowetting display 100, the shape of the interface between the low surface energy liquid 131 and the high surface energy liquid 130 was changed by responding to increase and decrease of voltage, and open and closure of the pixel region as shown in FIG. 2 were observed.

Example 11

(Synthesis of Gelling Agent)

The gelling agent was synthesized in the same manner as Example 9, except that 7.92 g (50 mmol) of 1-decanol was used as an alcohol. The fibrous crystal obtained was 6.5 g.

(Preparation and Evaluation of Display Cell)

The display cell was synthesized in the same manner as Example 9, except that the gelling agent (decyl-(s)-2-ammonium-2-isobutyl acetate, p-toluene sulfonate) synthesized as described above was used. In the same manner as Example 9, since the high viscosity material 131A was gelated with the gelling agent, it was not lifted or departed from the pixel even when the high surface energy liquid 130 was injected.

Then the electrowetting display 100 was prepared in the same manner as Example 9.

The obtained electrowetting display 100 was checked with a microscope, and it was confirmed that the low surface energy liquid 131 was evenly stored in the pixel G, which is surrounded by the pixel walls 127. When pulse voltage of 0 V/30 V with 30 Hz was applied to the pixel electrode 124 of the electrowetting display 100, the shape of the interface between the low surface energy liquid 131 and the high surface energy liquid 130 was changed by responding to increase and decrease of voltage, and open and closure of the pixel region as shown in FIG. 2 were observed.

Example 12

(Synthesis of Gelling Agent)

The gelling agent was synthesized in the same manner as Example 9, except that 2.95 g (25 mmol) of L-valine was used as an amino acid. The fibrous crystal obtained was 8.1 g, and the yield was 70%.

(Preparation and Evaluation of Display Cell)

The display cell was synthesized in the same manner as Example 9, except that the gelling agent (dodecyl-(s)-2-ammonium-2-isopropyl acetate, p-toluenesulfonate) synthesized as described above was used. In the same manner as Example 9, since the high viscosity material 131A was gelated with the gelling agent, it was not lifted or departed from the pixel even when the high surface energy liquid 130 was injected.

Then the electrowetting display 100 was prepared in the same manner as Example 9.

The obtained electrowetting display 100 was checked with a microscope, and it was confirmed that the low surface energy liquid 131 was evenly stored in the pixel G, which was surrounded by the pixel walls 127. When pulse voltage of 0 V/30 V with 30 Hz was applied to the pixel electrode 124 of the electrowetting display 100, the shape of the interface between the low surface energy liquid 131 and the high surface energy liquid 130 was changed by responding to increase and decrease of voltage, and open and closure of the pixel region as shown in FIG. 2 were observed.

Example 13

(Preparation of Gelling Agent)

Di-2-ethylhexyl sulfosuccinate sodium salt (hereinafter, abbreviated as AOT) and hydroquinone were mixed at a ratio by weight of 5:1, and stirred in ethanol at 60° C. for 1 hour, and then the ethanol was volatilized at a room temperature. The obtained semi-solid material was dried under vacuum at 60° C. for 12 hours to obtain a film-like gelling agent.

(Preparation and Evaluation of Display Cell)

The display cell was synthesized in the same manner as Example 9, except that the gelling agent (mixture of AOT and hydroquinone at 5:1) synthesized as described above was used. In the same manner as Example 9, since the high viscosity material 131A was gelated with the gelling agent, it was not lifted or departed from the pixel even when the high surface energy liquid 130 was injected.

Then the electrowetting display 100 was prepared in the same manner as Example 9.

The obtained electrowetting display 100 was checked with a microscope, and it was confirmed that the low surface energy liquid 131 was evenly stored in the pixel G, which was surrounded by the pixel walls 127. When pulse voltage of 0 V/30 V with 30 Hz was applied to the pixel electrode 124 of the electrowetting display 100, the shape of the interface between the low surface energy liquid 131 and the high surface energy liquid 130 was changed by responding to increase and decrease of voltage, and open and closure of the pixel region as shown in FIG. 2 were observed.

Example 14

(Preparation of Gelling Agent)

AOT and resorcinol were mixed at a ratio by weight of 5:1, and stirred in ethanol at 60° C. for 1 hour, and then the ethanol was volatilized at a room temperature. The obtained semi-solid material was dried under vacuum at 60° C. for 12 hours to obtain a film-like gelling agent.

(Preparation and Evaluation of Display Cell)

The display cell was synthesized in the same manner as Example 9, except that the gelling agent (mixture of AOT and resorcinol at 5:1) synthesized as described above was used. In the same manner as Example 9, since the high viscosity material 131A was gelated with the gelling agent, it was not lifted or departed from the pixel even when the high surface energy liquid 130 was injected.

Then the electrowetting display 100 was prepared in the same manner as Example 9.

The obtained electrowetting display 100 was checked with a microscope, and it was confirmed that the low surface energy liquid 131 was evenly stored in the pixel G, which was surrounded by the pixel walls 127. When pulse voltage of 0 V/30 V with 30 Hz was applied to the pixel electrode 124 of the electrowetting display 100, the shape of the interface between the low surface energy liquid 131 and the high surface energy liquid 130 was changed by responding to increase and decrease of voltage, and open and closure of the pixel region as shown in FIG. 2 were observed.

Example 15

(Preparation of Gelling Agent)

In methanol, 4-methyl cinnamic acid was dissolved, and dibenzylamine was slowly added. The mixing solution slightly generated heat for neutralization, and then the mixing solution was stirred at 60° C. for 1 hour to complete the neutralization. After that, the methanol was volatilized at a room temperature. The obtained solid material was dried under vacuum at 60° C. for 12 hours to obtain a film-like gelling agent.

(Preparation and Evaluation of Display Cell)

The display cell was synthesized in the same manner as Example 9, except that the gelling agent (4-methyl cinnamic acid dibenzylamine salt) synthesized as described above was used. In the same manner as Example 9, since the high viscosity material 131A was gelated with the gelling agent, it was not lifted or departed from the pixel even when the high surface energy liquid 130 was injected.

Then the electrowetting display 100 was prepared in the same manner as Example 9.

The obtained electrowetting display 100 was checked with a microscope, and it was confirmed that the low surface energy liquid 131 was evenly stored in the pixel G, which was surrounded by the pixel walls 127. When pulse voltage of 0 V/30 V with 30 Hz was applied to the pixel electrode 124 of the electrowetting display 100, the shape of the interface between the low surface energy liquid 131 and the high surface energy liquid 130 was changed by responding to increase and decrease of voltage, and open and closure of the pixel region as shown in FIG. 2 were observed.

Example 16

(Preparation of Gelling Agent)

The gelling agent was prepared in the same manner as Example 15, except that 3-chloro cinnamic acid was used instead of 4-methyl cinnamic acid.

(Preparation and Evaluation of Display Cell)

The display cell was synthesized in the same manner as Example 9, except that the gelling agent (3-chloro cinnamic acid dibenzylamine salt) synthesized as described above was used. In the same manner as Example 9, since the high viscosity material 131A was gelated with the gelling agent, it was not lifted or departed from the pixel even when the high surface energy liquid 130 was injected.

Then the electrowetting display 100 was prepared in the same manner as Example 9.

The obtained electrowetting display 100 was checked with a microscope, and it was confirmed that the low surface energy liquid 131 was evenly stored in the pixel G, which is surrounded by the pixel walls 127. When pulse voltage of 0 V/30 V with 30 Hz was applied to the pixel electrode 124 of the electrowetting display 100, the shape of the interface between the low surface energy liquid 131 and the high surface energy liquid 130 was changed by responding to increase and decrease of voltage, and open and closure of the pixel region as shown in FIG. 2 were observed.

INDUSTRIAL APPLICABILITY

The electrowetting element manufactured by the manufacturing method of the present invention does not show increase of applied voltage, delay of operation and the like, and thus can suitably be used, for example, as a display element.

REFERENCE SIGNS LIST

100 electrowetting display, 110 first substrate, 120 second substrate, 127 pixel wall, 130 high surface energy liquid, 130A high viscosity material, 131 low surface energy liquid, 131A high viscosity material, and 135 laminate.

What is claimed is:

1. A method for manufacturing an electrowetting element, in which a first liquid material and a second liquid material having a surface energy which is lower than that of the first liquid material, which are not mixed together are provided in a cell formed between a first substrate and a second substrate placed as facing; at least one of the first liquid material and the second liquid material is gelated or altered to have high viscosity; and a shape of the interface between the first liquid material and the second liquid material is changed by applying voltage in the cell;

the method comprising a step of applying a stimulation to at least one of the first liquid material and the second liquid material which is gelated or altered to have high viscosity, to alter at least one of the first liquid material and the second liquid material to have low viscosity.

2. The method for manufacturing an electrowetting element according to claim 1, further comprising the steps of:

placing a predetermined amount of the second liquid material in a region surrounded by partitions which compart the cell formed on the second substrate;

placing the first liquid material, which is gelated or altered to have high viscosity of 1 Pa·s or more, on one surface side of the first substrate; and bonding the first substrate and the second substrate through the first liquid material which is gelated or altered to have high viscosity.

3. The method for manufacturing an electrowetting element according to claim 1, further comprising steps of:

placing a predetermined amount of the second liquid material, which is gelated or altered to have high viscosity of 1 Pa·s or more, in a region surrounded by partitions which compart the cell formed on the second substrate;

placing the first liquid material in the region surrounded by partitions; and bonding the first substrate and the second substrate.

4. The method for manufacturing an electrowetting element according to claim 1, further comprising steps of:

placing a predetermined amount of the second liquid material, which is gelated or altered to have high viscosity of 1 Pa·s or more, in a region surrounded by partitions which compart the cell formed on the second substrate;

placing the first liquid material on one surface side of the first substrate; and bonding the first substrate and the second substrate through the first liquid material.

5. The method for manufacturing an electrowetting element according to claim 1, further comprising steps of:

placing a predetermined amount of a mixed liquid of the first liquid material and the second liquid material, which is gelated or altered to have high viscosity of 1 Pa·s or more, in a region surrounded by partitions which compart the cell formed on the second substrate;

placing the first liquid material in the region surrounded by the partitions, or on one surface side of the first substrate; and bonding the first substrate and the second substrate.

6. The method for manufacturing an electrowetting element according to claim 1, further comprising steps of:

placing a predetermined amount of the second liquid material, which is gelated or altered to have high viscosity of 1 Pa·s or more, in a region surrounded by partitions which compart the cell formed on the second substrate;

placing the first liquid material, which is gelated or altered to have high viscosity of 1 Pa·s or more, on one surface side of the first substrate; and bonding the first substrate and the second substrate through the first liquid material which is gelated or altered to have high viscosity.

7. The method for manufacturing an electrowetting element according to claim 1, further comprising steps of:

forming a laminate by laminating the first liquid material which is gelated or altered to have high viscosity of 1 Pa·s or more and the second liquid material which is gelated or altered to have high viscosity of 1 Pa·s or more; and bonding the first substrate and the second substrate by using the laminate.

8. The method for manufacturing an electrowetting element according to claim 7, wherein the bonding step is performed by transferring the laminate onto one of the first substrate and the second substrate.

9. The method for manufacturing an electrowetting element according to claim 1, wherein the stimulation is selected from the group consisting of contact with a chemical substance, irradiation with electromagnetic wave, heat, sonic wave, vibration, electric field and magnetic field.

10. The method for manufacturing an electrowetting element according to claim 1, wherein the second liquid material is gelated or altered to have high viscosity of 1 Pa·s or more by using a gelling agent or a viscosity increasing agent for the second liquid material, and the gelling agent or the viscosity increasing agent is dissolved in the first liquid material.

11. The method for manufacturing an electrowetting element according to claim 10, in which the gelling agent or the viscosity increasing agent is represented by the following general formula (1):

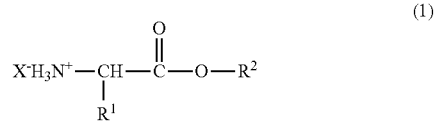

in the formula (1), $X^-$ represents a monovalent anion group; $R^1$ represents a monovalent substituent of 1 to 9 carbon atoms, and may contain any one selecting from the group consisting of oxygen, nitrogen and sulfur, and may contain a cyclic structure; and $R^2$ represents a monovalent substituent of 1 to 20 carbon atoms.

12. The method for manufacturing an electrowetting element according to claim 11, wherein $X^-$ is a conjugate base of an acid having an aromatic group.

13. The method for manufacturing an electrowetting element according to claim 11, wherein $R^1$ is any one of a methyl group, an isopropyl group, an isobutyl group, a sec-butyl group, and a benzyl group.

14. The method for manufacturing an electrowetting element according to claim 11, wherein $R^2$ is a linear chain alkyl group of 6 to 20 carbon atoms.

15. The method for manufacturing an electrowetting element according to claim 10, wherein the gelling agent or the viscosity increasing agent contains a compound represented by the following structural formula (2):

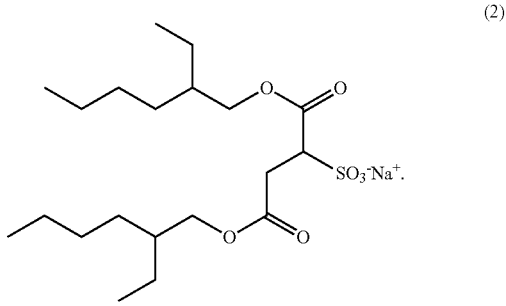

16. The method for manufacturing an electrowetting element according to claim 15, in which the gelling agent or the viscosity increasing agent is a mixture of the compound represented by the structural formula (2) and a steroid compound or a phenolic compound.

17. The method for manufacturing an electrowetting element according to claim 16, wherein the phenolic compound is hydroquinone or resorcinol.

18. The method for manufacturing an electrowetting element according to claim 10, wherein the gelling agent or the viscosity increasing agent contains a compound represented by the following general formula (3):

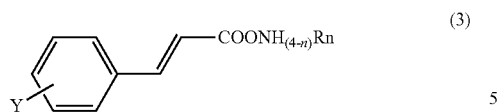

(3)

in the formula, n represents an integer of 1 to 3; R represents a monovalent organic group; and Y represents an optional monovalent substituent.

19. The method for manufacturing an electrowetting element according to claim 18, wherein Y is any one of a methyl group, a chloro group, and a bromo group.

20. The method for manufacturing an electrowetting element according to claim 18, wherein R is an aliphatic hydrocarbon or aralkyl group of 6 to 20 carbon atoms.

21. The method for manufacturing an electrowetting element according to claim 1, wherein the first liquid material is gelated or altered to have high viscosity of 1 Pa·s or more by using a gelling agent or a viscosity increasing agent for the first liquid material, and the gelling agent or the viscosity increasing agent is dissolved in the second liquid material.

22. The method for manufacturing an electrowetting element according to claim 1, wherein the step of altering at least one of the first liquid material and the second liquid material, which is gelated or altered to have high viscosity, to have low viscosity by stimulating inside of the cells, is performed after the bonding step of the first substrate and the second substrate.

23. An electrowetting display comprising an electrowetting element manufactured by the method for manufacturing an electrowetting element according to claim 1.

\* \* \* \* \*